(12) United States Patent
Bruzewicz et al.

(10) Patent No.: US 8,486,833 B2
(45) Date of Patent: Jul. 16, 2013

(54) FABRICATION OF CONDUCTIVE PATHWAYS, MICROCIRCUITS AND MICROSTRUCTURES IN MICROFLUIDIC NETWORKS

(75) Inventors: Derek A. Bruzewicz, Somerville, MA (US); Mila Boncheva-Bettex, Ecublens (CH); George M. Whitesides, Newton, MA (US); Adam Siegel, Cambridge, MA (US); Douglas B. Weibel, Madison, WI (US); Sergey S. Shevkoplyas, Cambridge, MA (US); Andres Martinez, Cambridge, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 953 days.

(21) Appl. No.: 11/920,483

(22) PCT Filed: May 18, 2006

(86) PCT No.: PCT/US2006/019787
§ 371 (c)(1),
(2), (4) Date: Mar. 2, 2010

(87) PCT Pub. No.: WO2007/061448
PCT Pub. Date: May 31, 2007

(65) Prior Publication Data
US 2011/0045577 A1 Feb. 24, 2011

Related U.S. Application Data

(60) Provisional application No. 60/682,174, filed on May 18, 2005.

(51) Int. Cl.
*H01L 21/44* (2006.01)
*H01L 21/4763* (2006.01)

(52) U.S. Cl.
USPC ........... 438/675; 438/674; 438/676; 438/677; 438/584; 422/502

(58) Field of Classification Search
USPC ................... 438/674, 675, 677, 584; 422/502
See application file for complete search history.

(56) References Cited

U.S. PATENT DOCUMENTS
3,075,280 A 1/1963 Jack et al.
(Continued)

FOREIGN PATENT DOCUMENTS
WO WO 84/03586 2/1984
(Continued)

OTHER PUBLICATIONS

Alm, et al, "A Fully Integrated Micromachined Magnetic Particle Separator," Journal of Microelectromechanical Systems, Vo. 5, No. 3, pp. 151-158 (1996).
(Continued)

*Primary Examiner* — In Suk Bullock
*Assistant Examiner* — Robert Eom
(74) *Attorney, Agent, or Firm* — Wolf, Greenfield & Sacks, P.C.

(57) ABSTRACT

Disclosed herein are a variety of microfluidic devices and solid, typically electrically conductive devices that can be formed using such devices as molds. In certain embodiments, the devices that are formed comprise conductive pathways formed by solidifying a liquid metal present in one or more microfluidic channels (such devices hereinafter referred to as "microsolidic" devices). In certain such devices, in which electrical connections can be formed and/or reformed between regions in a microfluidic structure; in some cases, the devices/circuits formed may be flexible and/or involve flexible electrical components. In certain embodiments, the solid metal wires/conductive pathways formed in microfluidic channel(s) may remain contained within the microfluidic structure. In certain such embodiments, the conductive pathways formed may be located in proximity to other microfluidic channel(s) of the structure that carry flowing fluid, such that the conductive pathway can create energy (e.g. electromagnetic and/or thermal energy) that interacts withy and/or affects the flowing fluid and/or a component contained therein or carried thereby. In other embodiments, a microsolidic structure may be removed from a microfluidic mold to form a stand-alone structure. In certain embodiments, the solid metal structures formed may interact with light energy incident upon a structure or may be used to fabricate a lightweight electrode. Another aspect of the invention relates to the formation of self-assembled structures that may comprise these electrically conductive pathways/connections.

17 Claims, 19 Drawing Sheets

U.S. PATENT DOCUMENTS

| | | | |
|---|---|---|---|
| 4,197,273 | A | 4/1980 | Dusserre et al. |
| 4,872,846 | A | 10/1989 | Clark |
| 4,978,491 | A | 12/1990 | Yagi et al. |
| 4,985,601 | A | 1/1991 | Hagner et al. |
| 5,094,811 | A | 3/1992 | Kane et al. |
| 5,512,131 | A | 4/1996 | Kumar et al. |
| 5,743,786 | A | 4/1998 | Lindsey |
| 5,776,748 | A | 7/1998 | Singhvi et al. |
| 5,820,014 | A | 10/1998 | Dozier, II et al. |
| 5,928,880 | A | 7/1999 | Wilding et al. |
| 5,955,029 | A | 9/1999 | Wilding et al. |
| 5,976,826 | A | 11/1999 | Singhvi et al. |
| 6,038,136 | A | 3/2000 | Weber |
| 6,103,479 | A | 8/2000 | Taylor |
| 6,167,910 | B1 | 1/2001 | Chow |
| 6,184,029 | B1 | 2/2001 | Wilding et al. |
| 6,234,373 | B1 | 5/2001 | Wark |
| 6,261,469 | B1 | 7/2001 | Zakhidov et al. |
| 6,267,819 | B1 | 7/2001 | Doyle et al. |
| 6,321,791 | B1 | 11/2001 | Chow |
| 6,334,301 | B1 | 1/2002 | Otsap et al. |
| 6,355,198 | B1 | 3/2002 | Kim et al. |
| 6,368,838 | B1 | 4/2002 | Singhvi et al. |
| 6,507,989 | B1 | 1/2003 | Bowden et al. |
| 6,581,438 | B1 * | 6/2003 | Hall et al. ............... 73/53.01 |
| 6,591,496 | B2 | 7/2003 | Koskenmaki et al. |
| 6,632,400 | B1 | 10/2003 | Brennen et al. |
| 6,645,432 | B1 | 11/2003 | Anderson et al. |
| 6,686,184 | B1 | 2/2004 | Anderson et al. |
| 6,719,868 | B1 | 4/2004 | Schueller et al. |
| 6,813,153 | B2 | 11/2004 | Koning et al. |
| 6,845,787 | B2 | 1/2005 | Karp et al. |
| 6,981,522 | B2 | 1/2006 | O'Connor |
| 2002/0064909 | A1 | 5/2002 | Gracias et al. |
| 2004/0087009 | A1 | 5/2004 | Schembri |

FOREIGN PATENT DOCUMENTS

| | | |
|---|---|---|
| WO | WO 97/33737 | 9/1997 |
| WO | WO 99/54786 | 10/1999 |
| WO | WO 01/03208 A1 | 1/2001 |
| WO | WO 01/89787 A2 | 11/2001 |
| WO | WO 01/89788 A2 | 11/2001 |

OTHER PUBLICATIONS

Arias, et al., "Fabrication of Metallic Heat Excahgers Using Sacrificial Polymer Mandrils," Journal of Microelectromechanical Systems, vol. 10, No. 1, pp. 107-112 (2001).

Bergveld, "The Challenge of Developing µTAS," Micro Total Analysis Systems, Proceedings of the µTAS '94 Workshop, Nov. 21-22, 1994, Kluwer Academic Publishers, pp. 1-4, 1995.

Blankenstein & Larsen, "Modular concept of a laboratory on a chip for chemical and biochemical analysis," Biosensors & Bioelectronics, vol. 13, No. 3-4, pp. 427-438, 1998.

Bloomstein & Ehrlich, "Laser-Chemical 3-D Micromachining," Mat. Res. Soc. Symp. Proc., vol. 282, pp. 165-171, 1993.

Bloomstein & Ehrlich, "Laser-chemical three-dimensional writing for microelectromechanics and application to standard-cell microfluidics," J. Vac. Sci. Tehcnolo. B, vol. 10, No. 6, pp. 2671-2674, Nov./Dec. 1992.

Bloomstein & Ehrlich, "Laser-Chemical Three-Dimensional Writing of Multimaterial Structures for Microelectromechanics," IEEE, pp. 202-203, 1991.

Boncheva, et al, "Templated Self-Assembly: Formation of Folded Structures by Relaxation of Pre-stressed, Planar Tapes," Advanced Materials, vol. 17, No. 5, pp. 553-557.

Boncheva, M. "Magnetic self-assembly of three-dimensional surfaces from planar sheets", PNAS, Mar. 15, 2005, vol. 102, No. 11, 3924-3929.

Brittain, et al., "Microorigami: Fabrication of Small, Three-Dimensional, Metallic Structures," J. Phys. Chem., vol. 105, pp. 347-350 (2001).

Chiu et al., "Patterned deposition of cells and proteins onto surfaces by using three-dimensional microfluidic systems," Proc. Natl. Acad. Sci., published on the Internet Feb. 2000; published in print vol. 97, No. 6, pp. 2408-2413, Mar. 2000.

Choi, et al., "A new magnetic bead-based, filterless bio-separator with planar electromagnet surfaces for integrated bio-detection systems," Sensors and Actuators, vol. 68, pp. 34-39 (2000).

Chung, et al., "Replication techniques for a metal microcomponent having real 3D shape by microcasting process," Microsystem Technologies, vol. 11, pp. 424-428 (2005).

Cohn, et al, "Microassembly Technologies for MEMS." SPIE Micromachining and Microfabrication, Conference on Micromachining and Microfabrication Process Technology IV, pp. 2-16, Santa Clara, CA, Sep. 21-22, 1998.

Deng, et al., "Manipulation of magnetic microbeads in suspension using micromagnetic systems fabricated with soft lithography," Applied Physics Letters, vol. 78, No. 12 (2001).

Duffy, et al., "Rapid Prototyping of Microfluidic Systems in Poly(dimethylsiloxne)," Anal. Chem., vol. 70, pp. 4974-4984 (1998).

Fettinger et al., "Stacked modules for micro flow systems in chemical analysis: concept and studies using an enlarged model," Sensors and Actuators B, vol. 17, pp. 19-25, 1993.

Fluitman et al., "Micromechanical Components for µTAS," Micro Total Analysis Systems, Proceedings of the µTAS '94 Workshop, Nov. 21-22, 1994, Kluwer Academic Publishers, pp. 73-83, 1995.

Gonzalez et al., "MicroJoinery: concept, definition, and application to microsystem development," Sensors and Actuators A, vol. 66, pp. 315-332, 1998.

Guérin et al., "Simple and Low Cost Fabrication of Embedded Micro-Channels by Using a New Thick-Film Photoplastic," 1997 International Conference on Solid-State Sensors and Actuators, Jun. 18-19, 1997, IEEE, pp. 1419-1422, 1997.

Harris, et al., "Fabrication, Modeling and Testing of Micro-Cross-Flow Heat Exhangers," Journal of Microelectromechanical Systems, vol. 11, No. 6, pp. 726-735(2002).

Harsh, et al., "Solder Self Assembly for MEMS," Proceedings of the 44th International Instrumentation Symposium (ISA '98), Reno, NV, May 3-7, 1998.

Harsh, et al., "Solder Self-Assembly for three-dimensional microelectromechanical systems", Sensors and Actuators, 77 (1999), 237-244.

Hayes, et al., "Active Control of Dynamic Supraparticle Structures in Microchannels," Langmuir, vol. 17, pp. 2866-2871 (2001).

Ikuta et al., "Three Dimensional Micro Integrated Fluid Systems (MIFS) Fabricated by Stereo Lithography," IEEE, pp. 1-6, 1994.

Jackman, et al., "Design and Fabrication of Topologically Complex, Three-Dimensional Microstructures," Science, vol. 280, pp. 2089-2091 (1998).

Jackman, et al., "Fabrication of Three-Dimensional Microstructures by Electrochemically Welding Structures Formed by Microcontact Printing on Planar and Curved Substrates," Journal of Microelectromechanical Systems, vol. 7, No. 2, pp. 261-266 (1998).

Jackman, et al., "Three-Dimensional Metallic Microstructures Fabricated by Soft Lithography and Microelectrodeposition," Langmuir, vol. 15, pp. 826-836 (1999).

Jo & Beebe, "Fabrication of Three-Dimensional Microfluidic Systems by Stacking Molded Polydimethylsiloxane (PDMS) Layers," SPIE Conference on Microfluidic Devices and Systems II, SPIE, vol. 3877, pp. 222-229, Sep. 1999.

Jo et al., "Three-Dimensional Micro-Channel Fabrication in Polydimethylsiloxane (PDMS) Elastomer," Journal of Microelectromechanical Systems, vol. 9, No. 1, pp. 76-81, Mar. 2000.

Kaajakari, V., et al., "Electrostatic batch assembly of surface MEMS using ultrasonictriboelectricity", Micro Electro Mechanical Systems, 2001. MEMS 2001. The 14th IEEE International Conference on Micro Electro Mechanical Systems, Interlaken, Switzerland, 2001, pp. 10-13.

Kenis et al., "Microfabrication inside capillaries using multiphase laminar flow patterning", Science, vol. 285, pp. 83-85, Jul. 2, 1999.

Kenis, et al., "Fabrication inside microchannels using fluid flow." Acc Chem Res., 33(12): 841-7, 2000.

Kumar & Whitesides, "Features of gold having micrometer to centimeter dimensions can be formed through a combination of stamping with an elastomeric stamp and an alkanethiol "ink"followed by chemical etching," Appl. Phys. Lett., vol. 63, No. 14, pp. 2002-2004, Oct. 1993.

Kunz et al., "Applications of lasers in microelectronics and micromechanics," Applied Surface Science, vol. 79/80, pp. 12-24, 1994.

Lammerink et al., "Modular Concept for Fluid Handling Systems, A demonstrator Micro Analysis System," IEEE, pp. 389-394, 1996.

Larsson et al., "Silicon Based Replication Technology of 3D-Microstructures by Conventional CD-Injection Molding Techniques," 1997 International Conference on Solid-State Sensors and Actuators, Jun. 16-19, 1997, IEEE, pp. 1415-1418, 1997.

LaVan, et al., "Simple, Three-Dimensional Microfabrication of Electrodeposited Structures," Angew. Chem. Int. Ed., vol. 42, No. 11, pp. 1262-1265 (2003).

Lee, et al., "Manipulation of biological cells using a microelectromagnet matrix," Applied Physics Letters, vol. 85, No. 6, pp. 1063-1065 (2004).

Lee, et al., "Microelectromagnets for the control of magnetic nanoparticles," Applied Physics Letters, vol. 79, No. 20, pp. 3308-3310 (2001).

Mao, et al., "Dissections: Self-assembled aggregates that spontaneously reconfigure their structures when their environment changes," J. Am. Chem. Soc. 2002, 124, 14508-14509.

Mensinger et al., "Microreactor with Integrated Static Mixer and Analysis System," Micro Total Analysis Systems, Proceedings of the µTAS '94 Workshop, Nov. 21-22, 1994, Kluwer Academic Publishers, pp. 237-243, 1995.

Nassuphis et al., "Three-dimensional laser direct writing: Applications to multichip modules," J. Vac. Sci. Technol. B, vol. 12, No. 6, pp. 3294-3299, Nov./Dec. 1994.

Pamme, N., "Magnetism and microfluidics," Lab Chip, vol. 6, pp. 24-38 (2006).

Piotter, et al., "Micro Powder Injection Molding," Advanced Engineering Materials, vol. 10, pp. 639-642 (2000).

Poplawski et al., "A Simple Package Process for Chemical Sensors," Solid-State Sensor and Actuator Workshop, Jun. 13-16, 1994, TRF, Solid-State Sensor and Actuator Workshop, Hilton Head, SC, Jun. 13-16, 1994, pp. 25-28, 1994.

Schomburg et al., "Components for Microfluidic Handling Modules," Micro Total Analysis Systems, Proceedings of the µTAS '94 Workshop, Nov. 21-22, 1994, Kluwer Academic Publishers, pp. 1-4, 1995.

Shimoyama et al., "3D micro-structures folded by Lorentz force", Micro Electro Mechanical Systems, 1998. Proceedings on the Eleventh Annual International Workshop on MEMS 98, Issue, Jan. 25-29, 1998, pp. 24-28.

Siegel, et al., Cofabrication of Electromagnets and Microfluidic Systems in Poly(dimethylsiloxane), Angew. Chem. Int. Ed., vol. 45, pp. 6877-6882 (2006).

Siegel, et al., "Microsolidics: Fabrication of Three-Dimensional Metallic Microstructures in Poly(dimethylsiloxane)," Adv. Mater., vol. 19, pp. 727-733 (2007).

Smistrup, et al., "Magnetic separation in microfluidic systems using microfabricated electromagnets—experiments and simulations," Journal of Magnetism and Magnetic Materials, vol. 293, pp. 597-604 (2005).

Syms, et al. "Surface tension-powered self-assembly of microstructures—The State-of-the-art", Journal of Microelectromechanical Systems, vol. 12, No. 4, Aug. 2003.

Takayama et al., "Patterning cells and their environments using multiple laminar fluid flows in capillary networks", Proc. Natl. Acad. Sci., vol. 96, pp. 5545-5548, May 1999.

Verpoorte et al., "Three-dimensional micro flow manifolds for miniaturized chemical analysis systems," J. Micromech. Microeng., vol. 4, pp. 246-256, 1994.

Wang, et al., "Rapid Prototyping of Masks for Through-Mask Electrodeposition of Thick Metallic Components," Journal of The Electrochemical Society, vol. 148, No. 5, pp. C363-C368 (2001).

Wirix-Speetjens, et al, "A force study of on-chip magnetic particle transport based on trapped conductors," IEEE Trans. Mag., vol. 41, pp. 4128-4133 (2005).

Wirix-Speetjens, et al., "On-Chip Magnetic Particles Transport by Alternating Magnetic Field Gradients," IEEE Transactions on Magnetics, vol. 40, No. 4, pp. 1944-1946 (2004).

Wu, et al., "Fabrication of Micro-Chain Mail by Simultaneous, Patterned Electrodeposition on a Plane and Multiple Cylinders," Angew. Chem. Int. Ed., vol. 40, No. 11, pp. 2059-2060 (2001).

Wu, et al., "Fabrication of Topologically Complex Three-Dimensional Microstructures: Metallic Microknots," J. Am. Chem. Soc., vol. 122, pp. 12691-12699 (2000).

Xia, et al., "Soft Lithography," Angew. Chem. Int. Ed., vol. 37, pp. 550-575 (1998).

Yan, et al., "Fabrication of Integrated Microelectrodes for Electrochemical Detection on Electrophoresis Microchip by Electroless Deposition and Micromolding in Capillary Technique," Anal. Chem., vol. 75, pp. 5406-5412 (2003).

Yi, et al., "Parallel Assembly of Hinged Microstructures Using Magnetic Actuation", Solid-State Sensor and Actuator Workshop, Hilton Head Island, South Carolina, Jun. 8-11, 1998, pp. 269-272.

Zou et al., "Development of vertical planar coil inductors using plasticdeformation magnetic assembly (PDMA)", Microwave Symposium Digest, 2001 IEEE MTT-S International, vol. 1, pp. 193-196, 2001.

International Search Report dated Oct. 16, 2007 in PCT/US2006/019787.

Written Opinion dated Oct. 16, 2007 in PCT/US2006/019787.

* cited by examiner

FABRICATION OF CONDUCTIVE PATHWAYS, MICROCIRCUITS AND MICROSTRUCTURES IN MICROFLUIDIC NETWORKS

FEDERALLY SPONSORED RESEARCH

Various aspects of the presented invention were sponsored by the National Institutes of Health (NIH) (Grant nos. GM065364 and GM067445), DARPA, the Office of Naval Research and the National Science Foundation (Grant no. MLR-0213805). The Government has certain rights in the invention.

RELATED APPLICATIONS

This application in a National Stage Application of International Patent Application Ser. No. PCT/US2006/019787, filed May 18, 2006, which claims priority to U.S. Provisional Patent Application Ser. No. 60/682,174, filed May 18, 2005, each of which are incorporated herein by reference.

FIELD OF INVENTION

One aspect of this invention generally relates to devices in which conductive pathways and electrical connections/circuits can be formed and/or reformed in a structure, particularly a microfluidic structure. In some cases, the devices involve flexible electrical circuits and/or components.

BACKGROUND

There are many uses for systems that cause fluid to flow through channels, including microfluidic channels, i.e., channels having at least one dimension in the micron range (less than one millimeter). For instance, there are many examples of systems for analyzing very small amounts of samples and reagents on chemical "chips" that include very small fluid channels and small reaction/analysis chambers. Small-scale systems are currently being developed for genetic analysis, clinical diagnostics, drug screening, and environmental monitoring. These systems must handle liquid or gas samples at very small scales, and must be compatible with chip-based substrates. Microfluidics, the behavior of fluid flow in very small-scale systems, therefore is central to the development of these systems. Many of these systems also require use of electrical circuits. In conventional devices, the microfluidic components and the electrically conductive pathways and components are separate structures, which can be difficult to combine and integrate together into a single device.

There are several established techniques for making metal microstructures in three dimensions. Electroplating and electroless deposition are standard methods for constructing microstructures with metallic layers several nanometers to several microns thick in two- or three-dimensions (Schlesinger, M. and M. Paunovic, eds., *Modern Electroplating*, New York: John Wiley, 2000). This approach to has been used to join hand-assembled, two-dimensional components electrochemically (Jackman, R. J. B., S. T.; Whitesides, G. M., Fabrication of Three-Dimensional Microstructures by Electrochemically Welding Structures Formed by Microcontact Printing on Planar and Curved Substrates. *Journal of Microelectromechanical Systems* 1998, 7, (2), 261-266). This method has been used for rapid prototyping of optical masks (Wang, W. H., Holl, M. R., Schwartz, D. T. Rapid prototyping of masks for through-mask electrodeposition of thick metallic components. *J. Electrochem. Soc.* 2001, 148(5):C363-C368). Microcontact printing has also been combined with electroplating (Jackman, R. J.; Brittain, S. T.; Adams, A.; Prentiss, M. G.; Whitesides, G. M., Design and fabrication of topologically complex, three-dimensional microstructures. *Science* 1998, 280, (5372), 2089-2091 and Jackman, R. J.; Brittain, S. T.; Adams, A.; Wu, H. K.; Prentiss, M. G.; Whitesides, S.; Whitesides, G. M., Three-dimensional metallic microstructures fabricated by soft lithography and microelectrodeposition. *Langmuir* 1999, 15, (3), 826-836, or electroless deposition (Wu, H. K.; Whitesides, S.; Whitesides, G. M., Fabrication of micro-chain mail by simultaneous, patterned electrodeposition on a plane and multiple cylinders. *Angewandte Chemie-International Edition* 2001, 40, (11), 2059-2060 and Wu, H.; Brittain, S.; Anderson, J.; Grzybowski, B.; Whitesides, S.; Whitesides, G. M., Fabrication of topologically complex three-dimensional microstructures: Metallic microknots. *Journal of the American Chemical Society* 2000, 122, (51), 12691-12699), to pattern metal onto the surface of capillaries. This technique was used to fabricate freestanding, three-dimensional cages of metal. Patterned metal layers have also been released from a two-dimensional template to generate a foldable metal structures and freestanding objects (Brittain, S. T.; Schueller, O. J. A.; Wu, H. K.; Whitesides, S.; Whitesides, G. M., Microorigami: Fabrication of small, three-dimensional, metallic structures. *Journal of Physical Chemistry B* 2001, 105, (2), 347-350. Metal has also been deposited onto flat, non-conducting surfaces by treatment with electrolytes in microfluidic channels (Yan, J. D., Y.; Liu, J.; Cao, W.; Sun, X.; Zhou, W.; Yang, X.; Wang, E., Fabrication of Integrated Microelecrodes for Electrochemical Detection on Electrophoresis Microchip by Electroless Deposition and Micromolding in Capillary Technique. *Analytical Chemistry* 2003, 75, 5406-5412). A related technique has been used to form metal patterns on curved surfaces (LaVan, D. A. G., P. M.; Langer, R., Simple, Three-Dimensional Microfabrication of Electrodeposited Structures. Angewandte Chemie-International Edition 2003, 42, (11), 1262-1265). All of these methods appear to have been used exclusively to pattern smooth surfaces.

To generate solid replicas of three-dimensional objects, several investigators have used a technique referred to as 'microcasting' (Piotter, V.; Benzler, T.; Gietzelt, T.; Ruprecht, R.; Hausselt, J., Micro powder injection molding. *Advanced Engineering Materials* 2000, 2, (10), 639-642 and Chung, S.; Park, S.; Lee, I.; Jeong, H.; Cho, D., Replication techniques for a metal microcomponent having real 3D shape by microcasting process. *Microsystem Technologies-Micro-and Nanosystems-Information Storage and Processing Systems* 2005, 11, (6), 424-428. Techniques based on LIGA (Lithographie, Galvanoformung and Abformung) can produce metallic objects by deposition of a metal onto a three-dimensional, molded polymer template that is subsequently removed to yield an open structure (such as a honeycomb arrangement of open cells) (Arias, F.; Oliver, S. R. J.; Xu, B.; Holmlin, R. E.; Whitesides, G. M., Fabrication of metallic heat exchangers using sacrificial polymer mandrills. *Journal of Microelectromechanical Systems* 2001, 10, (1), 107-112 and Harris, C.; Kelly, K.; Wang, T.; McCandless, A.; Motakef, S., Fabrication, modeling, and testing of micro-cross-flow heat exchangers. *Journal of Microelectromechanical Systems* 2002, 11, (6), 726-735). However, LIGA and other conventional injection molding techniques require expensive equipment (including metal molds) and metals, such as gold, high pressure (3-5 MPa for low pressure powder injection molding; higher for other techniques), can result in undesirable shrinking of the molded metal upon cooling (typically 15-22%).

A growing interest in flexible displays has fueled the development of polymer-metal composites and other materials. These most conventional approaches and composites require a layer-by-layer approach to making laminated materials, and methods based on nanoparticles require annealing at temperatures up to 200° C.

In addition, magnetic components have been used in lab-on-a-chip systems. Magnets have formed the basis of microfluidic pumps, mixers, and valves, and have been integrated into microfluidic systems to trap and move paramagnetic particles (Deng, T.; Whitesides, G, M.; Radhakrishnan, M.; Zabow, G.; Prentiss, M. Manipulation of magnetic microbeads in suspension using micromagnetic systems fabricated with soft lithography. *App. Phys. Lett.* 2001, 78, 1775-1777 and Lee, C. S.; Lee, H.; Westervelt, R. M. Microelectromagnets for the control of magnetic nanoparticles. *App. Phys. Lett.* 2001, 79, 3308-3310), and to guide the self-assembly of particles into structures (Hayes, M. A.; Polson, N. A.; Garcia, A. A. Active Control of Dynamic Supraparticle Structures in Microchannels. *Langmuir* 2001, 17, 2866-2871). There are several biologically-related applications where magnetically fields may be useful, including, for example immunoassays, acceleration of the hybridization of DNA and RNA, digestion of proteins, and sorting biomolecules. In cell biology, magnets have been used to isolate cells from whole blood, extract genomic DNA from cells, and to move magnetotactic bacteria. The use of magnetics in microfluidic systems has been reviewed recently (Pamine, N. Magnetism and microfluidics. *Lab Chip* 2006, 6, 24-38).

Electromagnets can have certain advantages over permanent magnets because they can be switched on/off rapidly using electrical signals, and the strength of their field can be adjusted. Electromagnets have been included in microfluidic systems for the manipulation of superparamagnetic beads. For example, electromagnets have been fabricated surrounding a microfluidic chamber by electroplating copper wires around a nickel-iron core, and have been used to capture superparamagnetic beads in channels (Ahn, C. H.; Allen, M. G.; Trimmer, W.; Jun, Y.; Erramilli, S. A fully integrated micromachined magnetic particle separator. J. *Microelectromech. Syst.* 1996, 5, 151-158). Other investigators have utilized other methods for combining electromagnets and microfluidics (Deng, T.; Whitesides, G, M.; Radhakrishnan, M.; Zabow, G.; Prentiss, M. Manipulation of magnetic microbeads in suspension using micromagnetic systems fabricated with soft lithography. *App. Phys. Lett.* 2001, 78, 1775-1777; Lee, C. S.; Lee, H.; Westervelt, R. M. Microelectromagnets for the control of magnetic nanoparticles. *App. Phys. Lett.* 2001, 79, 3308-3310; Wirix-Speetjens, R.; Fyen, W.; Xu, K.; De Boeck, J.; Borghs, G. A force study of on-chip magnetic particle transport based on trapped conductors. *IEEE Trans. Mag.* 2005, 41, 4128-4133; Smistrup, K.; Hansen, O.; Bruus, H.; Hansen, M. F. Magnetic separation in microfluidic systems using microfabricated electromagnets-experiments and simulations. *J. Mag. Mag. Mat.* 2005, 293, 597-604); Choi, J.; Ahn, C. H.; Bhansali, S.; Henderson, H. T. A new magnetic bead-based, filterless bio-separator with planar electromagnet surfaces for integrated bio-detection systems. *Sens. & Act. B* 2000, B68, 34-39 and Lee, H.; Purdon, A. M.; Westervelt, R. M. Manipulation of biological cells using a microelectromagnet matrix. *App. Phys. Lett.* 2004, 85, 1063-1065).

While these examples describe a range of useful devices and techniques, a need exists for other types of microfluidic devices comprising conductive pathways, circuits, electromagnets, etc.

SUMMARY OF THE INVENTION

Disclosed herein are a variety of microfluidic devices and solid, typically electrically conductive devices that can be formed using such devices as molds. In certain embodiments, the devices that are formed comprise conductive pathways formed by solidifying a liquid metal present in one or more microfluidic channels (such devices hereinafter referred to as "microsolidic" devices). In certain such devices, electrical connections can be formed and/or reformed between regions in a microfluidic structure; in some cases, the devices/circuits formed may be flexible and/or involve flexible electrical components. In certain embodiments, the solid metal wires/conductive pathways formed in microfluidic channel(s) may remain contained within the microfluidic structure. In certain such embodiments, the conductive pathways formed may be located in proximity to other microfluidic channel(s) of the structure that carry flowing fluid, such that the conductive pathway can create energy (e.g. electromagnetic and/or thermal energy) that interacts withy and/or affects the flowing fluid and/or a component contained therein or carried thereby. In other embodiments, a microsolidic structure may be removed from a microfluidic mold to form a stand-alone structure. In certain embodiments, the solid metal structures formed may interact with light energy incident upon a structure or may be used to fabricate a light-weight electrode. Another aspect of the invention relates to the formation of self-assembled structures that may comprise electrically conductive pathways/connections. The subject matter of the present invention involves, in some cases, interrelated products, alternative solutions to a particular problem, and/or a plurality of different uses of one or more systems and/or articles.

Certain aspects of the invention involve methods of fabricating electrically conductive pathways in microfluidic systems. In certain embodiments, such methods comprise acts of providing a structure defining a microfluidic system that comprises at least one substantially enclosed microfluidic channel. The method further involves causing a liquid metal to flow into at least a portion of the substantially enclosed microfluidic channel. The liquid metal is then cooled within the substantially enclosed microfluidic channel to a temperature less than its melting point, thereby causing the metal to become a solid. The solidified metal forms an electrically conductive pathway within the microfluidic system.

In certain such embodiments, the structure defining the microfluidic system comprises at least one layer having a length of the layer measured along a first direction, a width of the layer measured along a second direction and perpendicular to the first direction and a thickness of the layer measured along a third direction perpendicular to both the first and the second direction. The thickness of the layer is less than the width of the layer and less than the length of the layer. The substantially enclosed microfluidic channel is disposed within a layer but does not penetrate through and traverse the entire thickness of the layer. In certain such embodiments, the substantially enclosed microfluidic channel lies within a plane or curved surface that is defined by the configuration of the layer.

In certain embodiments of practicing the methods, at least a portion of the wall of the microfluidic channel is treated to enable the wall to be more easily wet by the liquid metal. Such treatment can comprise, for example, chemically altering at least a portion of the wall. A variety of materials may be used for this purpose, for example, a portion of the wall may be coated, for example, by metal deposition with a thin layer of gold or other metal able to improve wetting with a low temperature melting metal, such as solder. In other embodiments, chemicals such as alkanethiols or silanes may be used. In one particular example, the chemical used to treat at least a portion of the microfluidic wall to improve wetting comprises 3-mercaptopropyltrimethoxysilane. In certain embodiments, certain portions of the microfluidic channel may not be so treated, so that liquid metal preferentially wets and fills certain portions of the channel structure and not others.

A "microfluidic channel" as used herein refers to a channel having at least one cross-sectional dimension that is less than about 1 millimeter. In certain embodiments, the microfluidic channel has at least one cross-sectional dimension less than about 100 microns and other embodiments less than about 30 microns, and other embodiments less than about 10 microns, and yet other embodiments less than about 3 microns, and yet in other embodiments less than about 1 micron. In certain, typical embodiments, microfluidic channel will have at least one cross-sectional dimension between about 1 micron and about 100 microns.

In certain embodiments of the method, electrical components, such as resistors, light-emitting diodes (LED), electrodes, capacitors, inductors, integrated circuit chips, etc. may be included within the structure and the method may further involve forming an electrical connection between one or more such electrical components and at least a portion of the solidified liquid metal within the microfluidic system.

In certain embodiments, the microfluidic system can comprise a plurality of substantially enclosed microfluidic channels providing a plurality of conductive pathways after solidification of the liquid metal, such that a plurality of electrical connections may be formed between a plurality of electrical components and a plurality of conductive pathways, thereby forming an electrical circuit device. Such electrical circuit devices can comprise, for example, integrated circuitry for a "lab on a chip" device, a transformer, an electromagnet, an antenna, a computer, a radio, etc. In certain such electrical circuit devices, the conductive pathway formed by the present method may remain embedded within the microfluidic structure. In certain cases, the structure defining the microfluidic systems is formed of a flexible material, for example, a polymer material such as an elastomer. In certain embodiments, the flexible material comprises polydimethylsiloxane (PDMS). In certain cases, the structure comprising the microfluidic system utilized to mold the electrically conductive pathways is electrically insulating, and, optionally, thermally insulating.

In another set of embodiments, the invention involves a method of causing an electrical connection to be formed between a first region and a second region of a microfluidic system. In certain embodiments, such method comprises acts of providing a structure defining a microfluidic system comprising at least a first electrically-conductive region and a second electrically-conductive region not electrically connected to the first region, wherein the first region comprises an electrically-conductive metal. The method further comprises heating the first region comprising the electrically-conductive metal to a temperature greater than that of a melting point of the metal, thereby causing the metal to become liquid. The liquid metal is then caused to flow within the microfluidic system such that it contacts at least a portion of the second electrically-conductive region. The liquid metal is then cooled within the microfluidic system to a temperature that is less than the melting point of the metal, thereby resolidifying the metal.

In certain embodiments, at least one of the first electrically-conductive region and the second electrically-conductive region comprise solder or a solder alloy. In certain embodiments, the liquid metal may comprise one or more of tin, indium, silver, lead, bismuth, cadmium, zinc and antimony. In certain embodiments, the metal will have a melting point less than about 900° Celsius, and yet other embodiments less than about 400° Celsius, and yet other embodiments less than about 100° Celsius, and yet other embodiments less than about 40° Celsius, and in certain cases the metal will have a melting point between about 40° Celsius and about 400' Celsius. In certain embodiments, the first electrically-conductive region may be heated indirectly by heating the structure defining the microfluidic system.

In certain embodiments, at least one of the first and second electrically-conductive regions is electrically connected to an electrode. In certain such embodiments of the method, the method may further comprise applying an electrical potential to the first and second electrically-conductive regions, for example, to create an electrical current.

In order to cause the liquid metal to flow within the microfluidic system, in certain embodiments, a pressure differential is used, such as created by injecting the liquid metal with a syringe, pump, etc. or applying a vacuum to an outlet of the channel where the inlet of the channel is in fluid communication with a source of the liquid metal. In certain embodiments, the liquid metal is caused to flow within the microfluidic system by deforming at least a portion of the structure, such as by bending, twisting, compressing, stretching, etc. In yet other embodiments, the structure may be sonicated in order to facilitate flow of the liquid metal within the structure.

In another aspect, the invention involves a microfluidic structure. In certain embodiments, the microfluidic structure comprises a first structural portion, defining a first microfluidic channel, a second structural portion, defining a second microfluidic channel, a first electrically-conductive region comprising a metal having a melting point of less than about 900° Celsius contained within at least a portion of the first microfluidic channel, a second conductive region comprising a metal having a melting point of less than about 900° Celsius contained within at least a portion of the second microfluidic channel, a first electrode electrically connected to the first microfluidic channel, and a second electrode electrically connected to the second microfluidic channel. Furthermore, the structure can be constructed and arranged such that the first structural portion can be moved into a position approximate the second structural portion.

In yet other embodiments, the invention provides methods for self-assembly of electrical devices. Certain such methods involve providing a first structural portion of an electrical device comprising a first electrically-conductive region, providing a second structural portion comprising a second electrically-conductive region, and without contacting either the first or the second portions with an apparatus external to the first and the second portions to bring them into contact with each other, inducing the first and second structural portions to move relative to each other and to form an electrical connection between the first and second electrically-conductive regions under conditions in which at least the first structural portion deforms significantly during the process of moving.

In another set of embodiments, a method of forming a self-assembled structure is provided that comprises providing a component comprising a structural element, allowing the component comprising the structural element to deform significantly from a first shape to a second shape under conditions in which the first structural element is in a first, more flexible state, without contacting the component with an external apparatus to urge the component into the second shape, and converting the structural element to a second, more rigid state whereby the component is maintained in the second shape, at least in part, by the structural element.

Another method of self-assembly of an electrical device comprises providing a first structural portion comprising a first electrically-conductive region, providing a second structural portion comprising a second electrically-conductive region, and without contacting either the first or second portions with an apparatus external to the first and second portions to bring them into contact with each other, allowing the first and second structural portions to move relative to each other from a first configuration to a second configuration defining an electrical connection between the first and second electrically-conductive regions under conditions in which at least the first structural portion and the first electrically-conductive region deform significantly during the process of moving and the first electrically-conductive region is in the first, more flexible state. The method further involves converting the first electrically-conductive region to a second, more rigid state in the second configuration.

In another series of embodiments, the invention involves a method comprising acts of providing a structure defining a microfluidic channel comprising a first electrically-conductive region and a second electrically-conductive region not electrically connected to the first region, wherein each of the regions comprises a metal, and heating at least a portion of the electrically-conductive region to a temperature greater than the melting point of the metal. In certain such embodiments, the method comprises causing the heated metal to flow and form an electrical connection between the first electrically-conductive region and the second electrically-conductive region.

In yet another series of embodiments, the invention involves a method comprising acts of providing a structure defiling a substantially enclosed microfluidic channel free of liquid metal and flowing a liquid metal into at least a portion of the channel. In certain embodiments, the method further comprises after flowing the liquid metal into at least a portion of the channel, an act of solidifying the liquid metal to form a solid, electrically-conductive pathway. In certain embodiments, the structure is flexible and is initially in the form of a layer having a defined thickness and a substantially planar configuration; this method further comprises an act of deforming the layer into a substantially non-planar configuration. In certain embodiments, the layer is deformed before the metal is flowed into the channel; in other embodiments, the deforming of the layer occurs after the metal is solidified. In certain such embodiments, deforming the structure involves helically twisting the structure into, for example, a corkscrew-type helix.

In yet another series of embodiments, the invention involves a method comprising acts of providing a structure defining a first substantially enclosed microfluidic channel and a second substantially enclosed microfluidic channel, each of which contains a metal having a melting point of less than about 900° Celsius, wherein the first and second channels are not electrically connected to each other, and electrically connecting the first and second channels.

Another aspect of the invention involves a device comprising at least one electrically-conductive pathway. In certain embodiments, the device comprises a flexible structure defining a microfluidic system comprising at least one microfluidic channel, wherein an entire cross-section of at least a portion of the microfluidic channel is filled with a metal having a melting point of less than about 900 degrees Celsius.

In another aspect, the invention involves a device comprising at least one electrically-conductive pathway, the device comprising a structure defining a microfluidic system comprising at least two microfluidic channels wherein an entire cross-section of at least a portion of the first microfluidic channel is filled with a metal having a melting point of less than about 900 degrees Celsius, and wherein an entire cross-section of at least a portion of the second microfluidic channel contains a flowing fluid that is not a liquid metal. In certain such embodiments, the first microfluidic channel comprises a substantially enclosed microfluidic channel. In certain embodiments of the device, the first microfluidic channel is positioned in sufficiently close proximity to the second microfluidic channel, so that upon passing an electrical current through the metal, an electric field and/or magnetic field and/or thermal energy is generated that is able to substantially affect a property of the flowing fluid in the second microfluidic channel or a particle suspended in the flowing fluid. In certain such embodiments, the first microfluidic channel is positioned in sufficiently close proximity to the second microfluidic channel so that upon passing an electrical current through the metal an electric field and/or magnetic field is generated that is able to alter the trajectory of a particle suspended in the flowing fluid. In certain embodiments, the suspended particles may be magnetic particles, non-magnetic metallic particles, polymeric particles, biological cells, or mixtures of the above.

In certain embodiments of the above-described device, the structure defining the microfluidic system comprises a layer having a defined thickness and being substantially planar in configuration. In certain such embodiments, both the first microfluidic channel and the second microfluidic channel lie within a single level of the structure and within a plane that is substantially co-planar to a plane substantially co-planar with the layer. In certain such embodiments, the first microfluidic channel and the second microfluidic channel are substantially parallel to each other over a substantial portion of their lengths.

In certain embodiments the invention involves a device in which a first microfluidic flow path forms at least a part of a flow path that is helical in configuration and contains a metal. In certain such embodiments, at least a portion of a second microfluidic channel is circumscribed by this helical flow path. In one such embodiment, at least a portion of the first microfluidic flow path is positioned in sufficiently close proximity to the second microfluidic channel, so that upon passing an electrical current through the metal, sufficient thermal energy is generated that is able to heat the flowing fluid in the second microfluidic channel.

In yet another series of embodiments, the invention involves a device comprising at least one electrically-conductive pathway. In certain such embodiments, the device comprises a structure comprising a layer having a defined thickness and being substantially planar in configuration. This structure defines a microfluidic system comprising at least two microfluidic channels, wherein an entire cross-section of at least a portion of the first microfluidic channel contains a metal and wherein an entire cross-section of at least a portion of the second microfluidic channel contains a flowing fluid that is not a liquid metal. Both the first microfluidic channel and the second microfluidic channel lie within a single level of the structure and within a plane that is substantially co-planar to a plane substantially co-planar with the layer.

Other advantages and novel features of the present invention will become apparent from the following detailed description of various non-limiting embodiments of the invention when considered in conjunction with the accompanying figures. All references cited herein, whether patents, patent applications, or technical literature publications are incorporated herein by reference. In cases where the present specification and a document incorporated by reference include conflicting and/or inconsistent disclosure, the present specification shall control. If two or more documents incorporated by reference include conflicting and/or inconsistent disclosure with respect to each other, then the document having the later effective date shall control.

BRIEF DESCRIPTION OF THE DRAWINGS

Non-limiting embodiments of the present invention will be described by way of example with reference to the accompanying figures, which are schematic and are not intended to be drawn to scale. In the figures, each identical or nearly identical component illustrated is typically represented by a single numeral. For purposes of clarity, not every component is labeled in every figure, nor is every component of each embodiment of the invention shown where illustration is not necessary to allow those of ordinary skill in the art to understand the invention. In the figures.

DETAILED DESCRIPTION

Figure 1A:
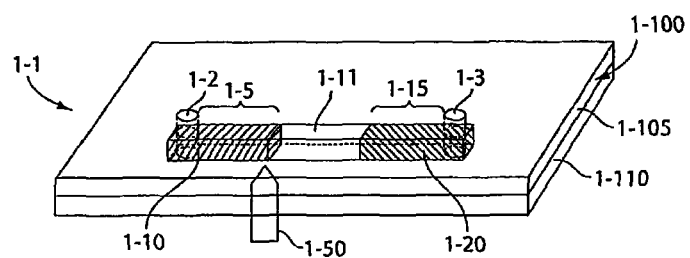
FIG. 1A illustrates a structure comprising a microfluidic channel having a first and a second electrically-conductive regions.

Disclosed herein are a variety of microfluidic devices and solid, typically electrically conductive devices that can be formed using such devices as molds. In certain embodiments, the devices that are formed comprise conductive pathways formed by solidifying a liquid metal present in one or more microfluidic channels (such devices and structures hereinafter referred to as "microsolidic" devices and structures). In certain such devices, in which electrical connections can be formed and/or reformed between regions in a microfluidic structure; in some cases, the devices/circuits formed may be flexible and/or involve flexible electrical, optical, mechanical, etc. components.

As illustrated in the examples below, the present inventive techniques for forming microsolidic structures can be used for fabricating flexible or stiff metal structures in two, three or more planar levels to make a variety of useful structures and circuits relatively simply and inexpensively. In certain embodiments, the process involves fabricating microfluidic channels in a microfluidic system or network and at least partially filling a portion of all or certain of the channels with a molten metal and cooling the network to allow the metal to solidify, thereby forming solid structures. While, as described below, a wide variety of materials and methods may be utilized for forming the microfluidic channels and networks, in certain preferred embodiments, the networks are fabricated in a curable polymeric material, which may in certain embodiments be flexible when cured, such as an elastomer (e.g., polydimethylsiloxane—PDMS). When utilizing, for example, PDMS, the microfluidic structures can be formed relatively simply utilizing soft lithography techniques known in the art, as discussed below. Using such methods, complex microsolidic structures having features in multiple levels can be fabricated via use of multilayered microfluidic network structures produced by techniques using multilayer lithography (e.g. see U.S. Pat. No. 6,645,432). Alternatively, for embodiments wherein the material forming the microfluidic network structure is flexible and deformable, three dimensional structures can be fabricated by deforming the microfluidic structure before, during or after insertion and solidification of the metal into the channels thereof. Such deformation can involve, for example, bending, twisting, rolling, etc. of the microfluidic structure. In certain embodiments wherein the structures are deformed substantially after a liquid metal has been solidified, it is preferred to use liquid metals, for example certain solders, that are able to be substantially deformed in the solid state without breaking. For example, certain indium-containing solders have this property.

In certain embodiments, the solid structures formed according to the invention can provide a plurality of electrically-conductive pathways providing electrical interconnections between a variety of electrical devices or components, which may also be associated with, contained within, attached to, etc. a microfluidic structure containing metal-filled channels. In certain such embodiments, the structures may comprise complex flexible circuits and electronic devices, for example "lab on a chip" devices, flexible electronic devices for example flexible radios, computers, transformers, heaters, electromagnetic devices, etc.

In certain embodiments, the invention provides a method for fabricating solid, electrically-conductive pathways in microfluidic network structures also containing channels and flow paths configured to permit fluid flow therethrough. In certain such embodiments, the electrically-conductive pathways can be configured and arranged so that they are able to affect some property of the fluid contained or flowing in a channel of a microfluidic network structure or agents and particles contained or flowing in a fluid within a microfluidic channel of such a device. For example, as discussed in Example 13 below, certain techniques of the present invention can be utilized to form a coil microheater able to heat fluid flowing in a channel within a microfluidic device. In another embodiment described in detail in Example 14, the inventive techniques are utilized to produce an electromagnet system that can be used for capturing, sorting, diverting, etc. magnetic particles suspended in a flowing stream in a microfluidic channel. In fact, the variety of devices that can be manufactured utilizing the techniques of the present invention is essentially unlimited. While by no means inclusive or even fully representative, the examples presented below illustrate some of the variety of devices that can be constructed using the inventive techniques disclosed herein. Examples include the above-described coil microheater and electromagnet, as well as a radio frequency transformer (Example 12) and a flexible FM radio (Example 11). In addition to these, the techniques disclosed herein can also be utilized to form complex 3-dimensional antenna designs at very small scales that are difficult or prohibitively expensive to fabricate using conventional techniques.

As described in more detail below, in certain preferred embodiments, especially those wherein microfluidic networks are constructed of polymeric materials not able to withstand very high temperatures, the metal used to form the conducting pathways and solid structures may one or more metals having a relatively low melting temperature, such as a solder or solder alloy. In certain such embodiments, electrically conductive pathways and electrical connections between electrically conductive regions of microfluidic structures provided according to the invention may be selectively formed, unformed, and may be "healable" if broken. For example, a microfluidic network according to the invention containing two regions each containing a low melting temperature metal may be heated, or, alternatively, a portion of the structure in proximity to one of the regions containing the conducting metal may be heated, to melt the metal contained in at least one of the regions so that it is able to flow or made to flow through one or more microfluidic channels to contact and form an electrical connection with another conductive region. In this way, by selectively applying heat sufficient to melt low melting temperature metals contained in a microfluidic network at particular locations and particular times, electrical connections can be formed and particular circuits can be made or unmade to provide a wide variety of real-time control over the configuration and performance of the overall device. For example, this is discussed in more detail below in the context of FIGS. 1, 2, Example 1, and Example 10.

In addition to being useful for forming electrical connections and circuits, the methods of the present invention are also useful for forming a variety of other microsolidic structures. For example, because metals and solders are opaque and, typically, reflective, microsolidic devices produced according to the present invention can be configured and utilized to act as diffraction gratings, interference filters, or other optical components. For example, in certain embodiments, techniques of the present invention can be utilized in the fabrication of flexible gratings, meshes, etc., which can be utilized for optical purposes. Alternatively, such gratings may also find use in filtration applications or for the fabrication of high surface area, low mass electrodes or catalytic substrates. Example 5 discussed below illustrates fabrication of such gratings in microfluidic structures.

While, in certain embodiments, it is advantageous to allow the fabricated microstructures to remain embedded in the channels of a microfluidic network structure, especially when such structures are flexible, it is also possible according to the invention to produce free-standing structures by removing solidified metal structures from a microfluidic network utilized as the mold structure to form the solid metal structure. In such embodiments, the structures may be removed from the microfluidic network either mechanically (e.g., see Example 7) and/or by using a chemical that is able to dissolve the microfluidic structure surrounding the molded solidified metal structures contained in the microfluidic structure (e.g. see Example 8). In certain embodiments, after removal of a molded microstructure from a microfluidic system, the removed microstructure may be coated with other metals (e.g., via electroplating, electroless deposition, etc.). In certain such embodiments, after coating, the microstructure may be heated to a temperature that exceeds the melting point of the low-temperature metal molded in the microfluidic network but not exceeding the melting point of the metal utilized to coat the microstructure released from the microfluidic network. In such embodiments, the low melting temperature metal component, may be removed leaving a free-standing, hollow metal structure comprising only the metal coated onto the microstructure (see, e.g., Example 9). Such a technique can be advantageous for forming light-weight, high surface area electrode or other structures made of gold, nickel, copper, or other relatively high melting temperature metals.

While microfluidic network structures described herein could potentially be fabricated via conventional photolithography, microassembly, or micromachining methods, for example, stereolithography methods, laser chemical three-dimensional writing methods, or modular assembly methods, as described in more detail below, in certain embodiments the microfluidic network structures are formed by a process involving replica molding techniques for producing individual layers which comprise one or more levels of the structures, as discussed below. As described in more detail below, such layers may be molded utilizing mold masters having various features on their surface(s) for producing channels of the structure. In some embodiments, the features are formed via a photolithography method, or can themselves comprise a molded replica of such a surface.

Certain microfluidic network structures that may be useful for practicing the inventive methods described herein can be formed from essentially any material comprising a solid material that comprises a solidified form of a hardenable liquid, and, in some embodiments, the structures can be injection molded or cast molded. Hardenable liquids may comprise polymers or precursors of polymers, which harden upon, or can be induced to harden during, molding to produce polymeric structures. Certain polymeric materials useful for forming microfluidic networks for practicing the invention may comprise elastomeric materials.

In certain embodiments, the microfluidic networks provided according to the invention are comprised of at least one discrete layer of polymeric material, and in other embodiments are comprised of at least two, three or more discrete layers of polymeric material A "discrete layer" or "layer" of material as used herein refers to a separately formed subcomponent structure of the overall microfluidic structure, which layer can comprise and/or contain one, two, or three, or more levels of the overall channel network of the microfluidic structure. As described and illustrated in more detail below, the discrete layers of the structure can be stacked together to form a three-dimensional, multi-level network, or multiple three-dimensional networks, if desired, and can also be, in some embodiments, placed between one or more support layers or substrate layers in order to enclose and fluidically seal channels of the lower and upper levels of the microfluidic structure (e.g. see FIGS. 4A, 4B, 9, and 10A-10E and Example 6).

Hardenable liquids potentially useful for forming a microfluidic network structure may comprise essentially any liquid known to those of ordinary skill in the art that can be induced to solidify or spontaneously solidifies into a solid capable of containing and transporting fluids (e.g. molten solders) contemplated for use in and with the microfluidic network structures. In certain embodiments, the hardenable liquid comprises a polymeric liquid or a liquid polymeric precursor (i.e. a "prepolymer"). Suitable polymeric liquids can include, for example, thermoplastic polymers, thermoset polymers, or mixture of such polymers heated above their melting point; or a solution of one or more polymers in a suitable solvent, which solution forms a solid polymeric material upon removal of the solvent, for example, by evaporation. Such polymeric materials, which can be solidified from, for example, a melt state or by solvent evaporation, are well known to those of ordinary skill in the art.

In certain embodiments, a hardenable liquid comprises a liquid polymeric precursor. Where the hardenable liquid comprises a prepolymeric precursor, it can be, for example, thermally polymerized to form a solid polymeric structure via application of heat; or, in other embodiments, can be photopolymerized. Curing and solidification via free-radical polymerization can be carried out as well. These and other forms of polymerization are known to those of ordinary skill in the art and can be applied to the techniques of the present invention without undue experimentation. All types of polymerization, including cationic, anionic, copolymerization, chain copolymerization, cross-linking, and the like can be employed, and essentially any type of polymer or copolymer formable from a liquid precursor can comprise the hardenable liquid in accordance with the invention. An exemplary, non-limiting list of polymers that are potentially suitable include polyurethane, polyamides, polycarbonates, polyarylates, polyacetylenes and polydiacetylenes, polyphosphazenes, polysiloxanes, polyolefins, polyesters, polyethers, poly(ether ketones), poly(alkaline oxides), poly(ethylene terephthalate), poly(methyl methacrylate), polystyrene, and derivatives and block, random, radial, linear, or teleblock copolymers, cross-linkable materials such as proteinaceous materials and/or blends of the above. Gels are suitable where dimensionally stable enough to maintain structural integrity upon removal from the mold masters. Also suitable are polymers formed from monomeric alkylacrylates, alkylmethacrylates, alpha-methylstyrene, vinyl chloride and other halogen-containing monomers, maleic anhydride, acrylic acid, acrylonitrile, and the like. Monomers can be used alone, or mixtures of different monomers can be used to form homopolymers and copolymers. The particular polymer, copolymer, blend, or gel can be selected by those of ordinary skill in the art using readily available information and routine testing and experimentation so as to tailor a particular material for any of a wide variety of potential applications. One factor to be considered for embodiments in which a liquid metal will be added to the microfluidic channels is that the polymer used to form the microfluidic network structure should remain a solid and, preferably, be chemically and dimensionally stable at the temperature at which the molten metal will be added to the channels of the structure.

According to some embodiments of the invention, the hardenable liquid comprises a fluid prepolymeric precursor which forms an elastomeric polymer upon curing and solidification. A variety of elastomeric polymeric materials are suitable for such fabrications. A non-limiting list of examples of such polymers includes polymers of the general classes of silicone polymers, epoxy polymers, and acrylate polymers. Epoxy polymers are characterized by the presence of a three-membered cyclic ether group commonly referred to as an epoxy group, 1,2-epoxide, or oxirane. For example, diglycidyl ethers of bisphenol A can be used, in addition to compounds based on aromatic amine, triazine, and cycloaliphatic backbones. Another example includes the well-known Novolac polymers. Examples of silicone elastomers suitable for use according to the invention include those formed from precursors including the chlorosilanes such as methylchlorosilanes, ethylchlorosilanes, and phenylchlorosilanes, and the like. A preferred silicone elastomer is polydimethylsiloxane (PDMS). Exemplary polydimethylsiloxane polymers include those sold under the trademark Sylgard by Dow Chemical Co., Midland, Mich., and particularly Sylgard 182, Sylgard 184, and Sylgard 186.

Silicone polymers, for example, PDMS, are preferred for use in certain embodiments of the invention because they have several desirable beneficial properties simplifying fabrication of the microfluidic network structures, described herein. First, such materials are inexpensive, readily available, and can be solidified from a prepolymeric liquid via curing with heat. For example, PDMSs are typically curable by exposure of the prepolymeric liquid to temperatures of about, for example, 65° C. to about 75° C. for exposure times of about, for example, 1 hour. Second, silicone polymers, such as PDMS, are elastomeric and microfluidic networks formed from elastomeric materials can have the advantage of providing structures which are flexible and conformable, and can also be more easily fabricated to include active elements therein, for example integrated valves and pumping elements, which elements can utilize the flexibility and elasticity of the material for their performance.

Another advantage for forming microfluidic networks from silicone polymers, such as PDMS, is the ability of such polymers to be oxidized, for example by exposure to an oxygen-containing plasma such as an air plasma, so that the oxidized structures contain at their surface chemical groups capable of cross-linking to other oxidized silicone polymer surfaces or to the oxidized surfaces of a variety of other polymeric and non-polymeric materials. Thus microfluidic structures produced utilizing silicone polymers, such as PDMS, can be oxidized and essentially irreversibly sealed to other silicone polymer surfaces, or to the surfaces of other substrates reactive with the oxidized silicone polymer surfaces, without the need for separate adhesives or other sealing means. In addition, microfluidic structures formed from oxidized silicone polymers can include channels having surfaces formed of oxidized silicone polymer, which surfaces can be much more hydrophilic than the surfaces of typical elastomeric polymers and more reactive with certain surface treating agents, such as certain silanes useful for practicing certain embodiments of the invention. Such hydrophilic channel surfaces can thus be more easily filled and wetted with aqueous solutions than can structures comprised of typical, unoxidized elastomeric polymers or other hydrophobic materials.

In addition to being irreversibly sealable to itself, oxidized PDMS can also be sealed irreversibly to a range of oxidized materials other than itself including, for example, glass, silicon, silicon oxide, quartz, silicon nitride, polyethylene, polystyrene, glassy carbon, and epoxy polymers, which have been oxidized in a similar fashion to the PDMS surface (for example, via exposure to an oxygen-containing plasma). Oxidation and sealing methods useful in the context of the present invention are described in more detail below and also in Duffy et al., *Rapid Prototyping of Microfluidic Systems and Polydimethylsiloxane*, Analytical Chemistry, Vol. 70, pages 474-480, 1998, incorporated herein by reference.

The invention, in certain embodiments, provides methods for fabricating complex, metallic microstructures in three dimensions (in one, two, three or more planar levels) by injecting liquid metal, e.g. solder, into microfluidic channels and allowing the metal to cool and solidify. After fabrication, in certain embodiments, the metallic structures can be flexed, bent, or twisted without breaking. This method of fabrication, also termed "microsolidics" herein—in certain embodiments takes advantage of known methods of fabricating microfluidic channels in a moldable/curable polymer (e.g. poly(dimethylsiloxane) (PDMS)), and particularly for fabricating single and multi-level/multi-layer PDMS microfluidic networks. As described in more detail below, in certain embodiments, the channels of the microfluidic network is treated to control the interfacial free energy of the metal-polymer interface by using appropriate surface chemistries. This inventive approach makes it possible in certain embodiments to build flexible electronic circuits or connections between circuits, complex embedded or freestanding 3-D metal microstructures, 3-D electronic components, and hybrid electronic-microfluidic devices.

Figure 5:
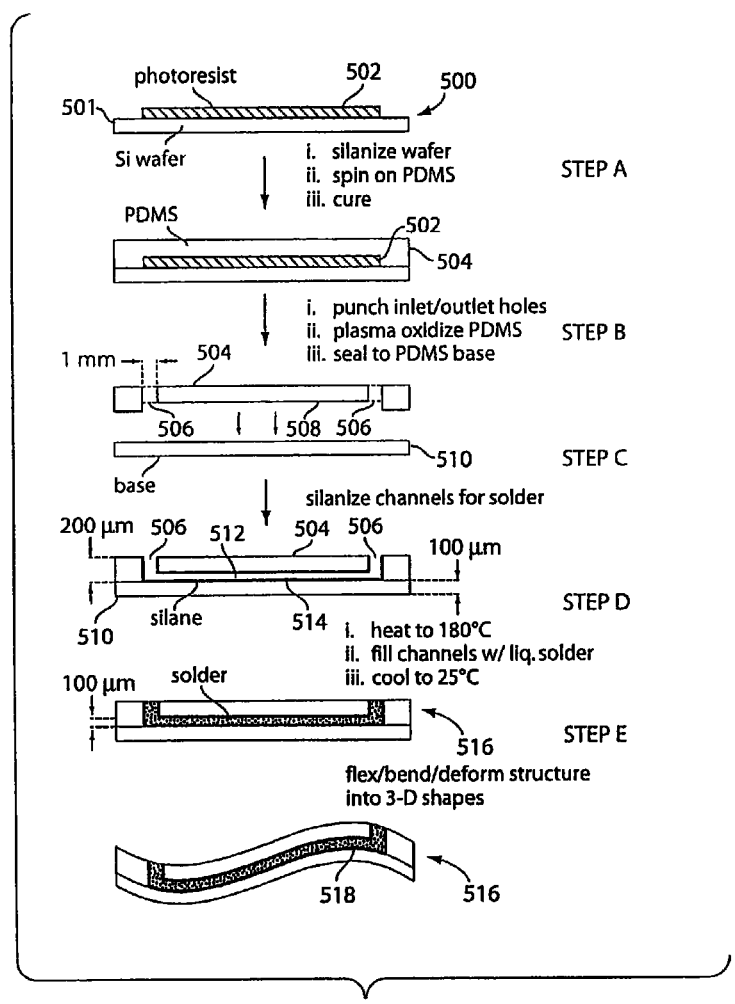
FIG. 5 shows a series of schematic cross-sectional views illustrating a method for fabrication of flexible metallic microstructures by injecting liquid solder into microfluidic channels.

In certain embodiments, the invention provides a technique for fabricating metallic microstructures in three dimensions by injecting molten solder into networks of microfluidic channels made of PDMS (e.g. see FIG. 5). This technique makes it possible, for example, to fabricate metallic structures having very small cross-sectional dimensions: e.g. 50 µm in diameter and 10 µm-1 mm thick. In one set of embodiments (e.g. see Example 5), the inventive procedure comprises at least the following five steps: (i) fabrication of microfluidic channels in a PDMS microfluidic network structure using techniques of soft lithography and rapid prototyping; (ii) oxidation and coating of the inside surface of the at least a portion of one or more microchannels (e.g. with a deposited metal, an alkanethiol or a silane, such as with 3-mercaptopropyltrimethoxysilane) to reduce their free surface energy and make them more wettable to metals; (iii) introduction of molten solder into the channels by pressure injection, pumping, or applying a vacuum to draw metal into the channels—walls of channels that are surface treated can be more rapidly wet by liquid solder while unmodified walls channels may not be wet, thereby leaving voids in the structure; (iv) cooling the channels to form solid metal microstructures; and (v) forming the solder-filled system of channels into non-planar morphologies (if desired) by bending, twisting, rolling, etc. the microfluidic network structure (this technique of modifying the shape works particularly well when the metal is encapsulated in relatively thin (50-200 microns) layers of PDMS. A useful characteristic of having the metal structures encapsulated in a layer of PDMS is that any breaks and defects in the metal structures—such as those caused from bending the structures—may be repaired by heating the channel above the melting temperature of the solder alloy, and cooling. The PDMS matrix can be dissolved, if desired, at any time with a suitable solvent, for example tetrabutylammonium fluoride (TBAF), to yield freestanding three-dimensional metal structures that may be modified further by electroplating or other techniques (e.g. see Examples 7-9).

This inventive methods of fabricating metallic microstructures can be rapid, simple, reproducible, and require minimal equipment. In contrast to typical conventional microfabrication techniques (e.g. evaporation or electroplating), in which metal is typically patterned layer-by-layer upon rigid substrates, the metal used in microsolidic structures of the present invention may be injected in one step into a network of microfluidic channels, for example embedded in a flexible PDMS mold. This process can make it possible to fabricate structures that are difficult or time-consuming to make using other methods. An exemplary and non-limiting list of microsolidic structures that can be fabricated according to the invention include planar metallic structures a flexible microfluidic network that can be bent, twisted, coiled, knotted, rolled, or braided in three dimensions without breaking and complex metallic structures embedded in a flexible microfluidic network having three-dimensional, multi level topologies such as a basket-weave pattern or a coil wound around a microfluidic channel (see FIGS. 4A and 4B and Example 6). Such complex structures have applications in, for example, electronics. For example, disclosed in detain in the Examples section are several electronic devices embedded in PDMS fabricated according to the invention: a flexible FM radio, a radiofrequency transformer, a coil heater for microfluidic channels, and an electromagnet for capturing, releasing and diverting paramagnetic particles. As but one example demonstrating some of the many capabilities of the present invention, an FM radio can be fabricated that comprises an 8-pin DIP processor, resistors, capacitors, an external 9 V battery, and external headphones. The connecting wires of the device were composed of metal solder injected into microfluidic channels according to the procedures described herein. The radio can be bent and twisted and still successfully receive and amplify FM radio stations from 87.9 FM to 107.9 FM.

In certain embodiments, it is also possible to control the final shape of embedded wires/conductive pathways after manipulating the shape of the material, by modifying the cross-sectional area of the wires/conductive pathways. The mechanical properties of the wires/conductive pathways may also be manipulated by increasing the thickness of the material comprising the microfluidic mold structure surrounding the wires/conductive pathways or the composition of the metal alloy injected into the microfluidic channels.

The techniques provided by the present invention can, in certain instances, provide certain advantages over typical prior art microfabrication techniques. For example, solder microstructures of the present invention can be simple to fabricate and may require minimal equipment (e.g. a hotplate and syringe/pump/source of vacuum) beyond that already typically used for conventional rapid prototyping of microfluidic systems. In addition, solder microstructures of the present invention can be fabricated rapidly—e.g. the process of heating a PDMS mold, injecting liquid solder into microfluidic channels, and cooling the structure to 25° C. may take less than 5 min., depending on the size of the structure. Also, in certain embodiments of the invention, microfluidic channels and metallic features can be fabricated using only one lithographic mask—the shape of the microsolidic structures can be arbitrary and are defined by lithography. Moreover, the inventive techniques, in certain embodiments can make it possible to fabricate metal structures—e.g. wires, electrodes, and electromagnets—in close proximity (e.g. <10 μm, <5 μm, <3 μm, <2 μm or <1) to microfluidic channels in certain embodiments in a single step. As mentioned previously, the inventive metal microsolidic structures may be used for many purposes, for example to heat liquids flowing in a microfluidic channel and/or for producing electric or magnetic fields. In certain embodiments in which an insulating material is used to form the microfluidic mold structure, the conductive pathways formed and are insulated from microfluidic channels by a thin layer of the insulating material (e.g. PDMS).

Furthermore, the inventive techniques, in certain embodiments, are not restricted to patterning metal structures on smooth surfaces. In certain embodiments, metal structures with a thickness of tens or hundreds of microns are possible using the inventive techniques, without requiring expensive plating solutions, equipment for LIGA, or long evaporation steps for fabrication. Advantageously, in certain embodiments, metallic wires produced using the inventive techniques can have a high electrical conductivity (e.g. ≧20% of the conductivity of silver). Also, when using low melting temperature metals, such as solders, microsolidic structures of the invention can be "healed": i.e. the solder in the device may be remelted and reflowed to repair any cracks or defects in the continuity of the solder wires. In certain embodiments of the invention, the inventive techniques makes it possible to fabricate multilevel/multilayer metal structures with complex topologies that are difficult, or time-consuming, to produce using typical prior art methods. In certain embodiments, the metal in a microsolidic structure of the invention is molded in one step after the fabrication of microfluidic channels. For example, in certain embodiments, metal features can traverse multiple layers (between 1 to >16 (e.g. see Example 6 and FIG. 10C)) of microfluidic channels and can be fabricated ≦10 μm to >100 μm thick. In certain embodiments, it is possible to manipulate a single layer structure so as to fabricate flexible metallic wires with three dimensional topology/directionality, for example by using flexible structures that are bent/twisted/rolled into structures that maintain their shape by manipulating, for example, one or more of the thickness of the metal, the thickness and/or composition of the microfluidic mold structure surrounding the metal, and/or the properties of the metal that is injected into the channels.

Certain embodiments of the present invention provide new approaches for making complex, three-dimensional metal wires and microstructures embedded in a microfluidic network and complex freestanding metallic microstructures. Such wires and microstructures can be used to make flexible electronic circuits, three-dimensional electronic components, and hybrid electronic-microfluidic devices. Various application of the inventive techniques can include, but are not limited to fabrication of radiofrequency or microwave antennas, or arrays of antennas, anodes for flexible or microscale batteries, catalytic surfaces in microscale or lightweight batteries, magnetic field generators, materials for controlling light in 3-D microsystems, integrated circuits made without wirebonding, etc.

Figure 17A:
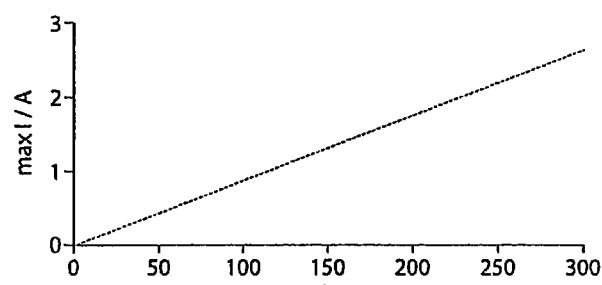
FIG. 17A, FIG. 17B, and FIG. 17C are graphs showing the maximum current, magnetic field, and force upon magnetic bead, respectively, calculated from equations 1, 3, and 11.
Figure 17B:
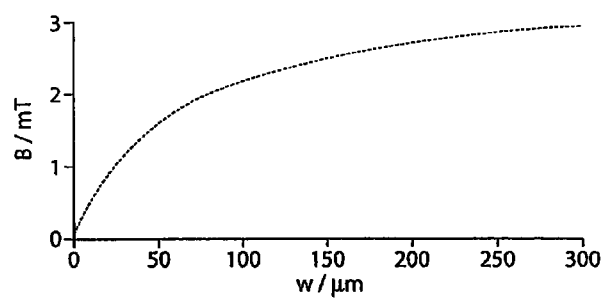
Figure 17C:
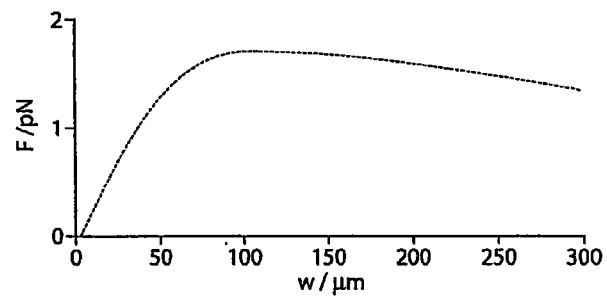
Figures 18A, 18B, 18C:
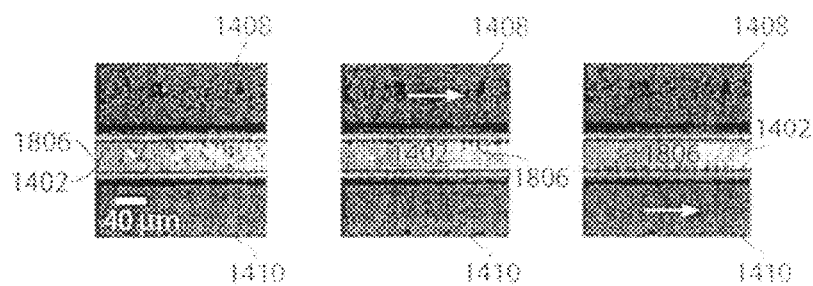
FIGS. 18A-18C are photocopies of photographic images of the microfluidic channel of the electromagnet device of FIG. 14B, showing paramagnetic beads flowing within the channel with no current applied to the electromagnets (FIG. 18A) after current was applied to the top electromagnet (FIG. 18B) and after current was applied to the bottom electromagnet (FIG. 18C)

One particular application of the present invention for fabricating a hybrid electronic/microfluidic structure involves fabrication of an electromagnet system. This application is described in much greater detail below in Example 14, an exemplary device is illustrated in FIGS. 14-18. In certain embodiments, the invention provides a simple method for fabricating electromagnets with micron-scale dimensions in a microfluidic network in close proximity to microfluidic channels (e.g. ≦10 μm away). By passing electrical current through the wires, magnetic fields and magnetic field gradients may be created in adjacent microfluidic channels. In certain embodiments, the microsolidic electromagnet of certain embodiments of the invention can be used to rapidly (e.g. <1 s) capture and release superparamagnetic beads or other magnetic particles suspended in the flow in adjacent microfluidic channels (FIG. 18A-18C). Certain of the electromagnets may also be used to sort a suspension of particles, e.g. superparamagnetic beads, flowing through a channel into one of two microfluidic channels at a junction (FIGS. 18E-18G). The inventive electromagnet devices can be constructed and configured (see FIG. 16) such that when an electrical current is passed through the wires of the device to generate magnetic fields and magnetic field gradients in adjacent microfluidic channels, these fields and gradients are substantially orthogonal to the direction of the electrical current in the wires. The strength of the magnetic field and magnetic field gradient may be controlled by adjusting the magnitude of the currents through the wires.

The inventive method of fabricating electromagnets near microfluidic channels can be rapid, simple, reproducible, and require minimal equipment. Channels for fluids and electromagnets can also be advantageously fabricated in the same plane and in a single step. Moreover, since this approach can make it possible to fabricate multiple electromagnets in a microfluidic system using one mask for lithography, no alignment is necessary. The inventive techniques can produces electromagnets without the need for silicon micromachining.

The electromagnets made using the inventive technique, unlike permanent magnets, in certain embodiments can be turned on/off using electrical switches. The currents passing through the electromagnets can take a variety of waveforms, and thereby produce magnetic fields with complex time dependence.

The electromagnets able to be produced according to the invention may have a cross-sectional area >4000 µm$^2$ and can withstand electrical currents >1 A and current densities >22 kA/cm$^2$ in certain embodiments. These characteristics may make it possible to produce magnetic fields >2.8 mT and magnetic field gradients >40 T/m in microfluidic channels adjacent to the electromagnets. These magnetic field gradients exert a force on superparamagnetic beads >3 pN.

The inventive electromagnet systems may provide microsystem engineers with a new component for microfluidics and integrated function, applied physicists with a means to generate electrically-controllable magnetic fields in microsystems, chemists and biotechnologists with a means to manipulate beads functionalized with biomolecules and/or cells decorated with magnetic beads or particles in a microsystem. In one exemplary series of applications, an electromagnet system of the invention can be used to bring cells in contact with a surface, or to perform reactions on a surface of a bead by bringing a functionalized bead in contact with the functionalized wall of a microfluidic channel.

In certain embodiments, multiple electromagnets can be constructed in a single microfluidic device to generate several local magnetic fields. Each electromagnet may be activated independently using independent electrical signals. In addition to generating magnetic fields, it is possible to use the electromagnets to heat microfluidic channels and to apply electric fields across microfluidic channels.

One aspect of the invention provides a microfluidic channel comprising a first and a second electrically-conductive region that are not in electrical connection with each other; the electrically-conductive regions may, for instance, comprise a metal, and the metal of the first conductive region may be melted and the liquid metal can flow in the channel to form an electrical connection with the second conductive region. In one set of embodiments, the metal comprises solder and the microfluidic channel may comprise a flexible material, for example, poly(dimethylsiloxane) (PDMS).

Another aspect of the invention relates to the formation of connections between components; these connections can be formed by a self-assembly process. In one set of embodiments, a flexible component, which comprises a metal wire, can be heated to melt the metal wire, and the component may be further manipulated to form a structure having a confirmation or shape, or other organization of components, different from that prior to manipulation; the component including the wire may be cooled, and can be used to form a three-dimensional electrical circuit.

One aspect of the invention provides systems and methods configured for causing an electrical connection to be formed between a first region and a second region of a structure such as a microfluidic system, for example, as shown in the embodiment illustrated in FIG. 1. In FIG. 1A, a fluidic device 1-1 is illustrated, which may be, for example, a microfluidic device. Device 1-1 can be formed out of one or more polymeric materials 1-100, such as PDMS. Other suitable materials are were described previously and also below. In the embodiment illustrated in FIG. 1A, device 1-1 is shown as being formed of two generally planar components, or layers 1-105, and 1-110; however, in other embodiments, device 1-1 can be formed of more or fewer layers of material. Within device 1-1 are ports 1-2 and 1-3, which may be, for example, inlets and/or outlets. Ports 1-2 and 1-3 are in fluidic communication through a microfluidic channel 1-11. In the embodiment illustrated in FIG. 1A, ports 1-2 and 1-3 are connected via a single channel 1-11. In the illustrated embodiment, channel 1-11 comprised a substantially enclosed microfluidic channel, defined below, lying within a single level of the structure and within (i.e. with its longitudinal axis aligned with) a plane that is substantially coplanar to a plane substantially coplanar with layers 1-105 and 1-110. In other embodiments, device 1-1 may include additional ports in addition to ports 1-2, and 1-3, and/or additional microfluidic channels, which may each be in fluidic communication with microfluidic channel 1-11, and/or independent from microfluidic channel 1-11. In other arrangements, no ports are provided; only one or more channels.

As shown in FIG. 1A, microfluidic channel 1-11 includes a first electrically-conductive region 1-5, and a second electrically-conductive region 1-15. As shown, these electrically-conductive regions are not in electrical connection with each other (the conductive regions can be formed as such, or can be the result of an connection being broken or otherwise separated). One or both of electrical conductive regions 1-5 and 1-15 can include an electrically-conductive material, for example, a metal. In some cases, the metal has a relatively low melting point, as further discussed below. For example, the first electrically-conductive region 1-5 may comprise a low melting point solder 1-10, and the second electrically-conductive region 1-15 may comprise another low melting point solder 1-20.

Figure 1B:
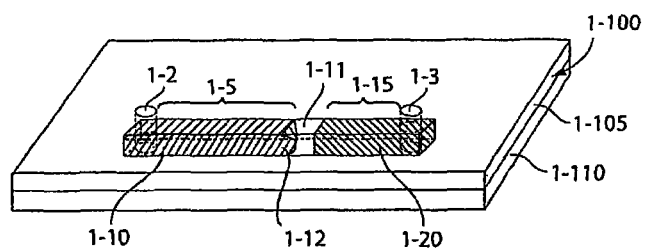
FIG. 1B illustrates a structure comprising a microfluidic channel having a first and a second electrically-conductive regions, where a portion of the first electrically-conductive region is melted.
Figure 1C:
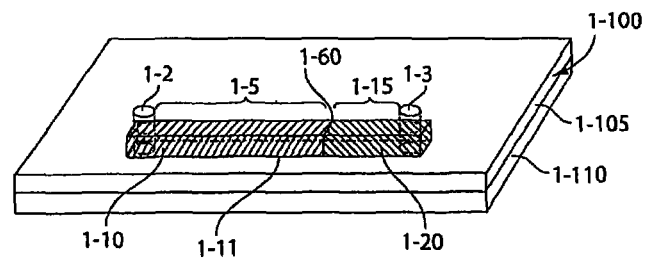
FIG. 1C illustrates a structure comprising a microfluidic channel having a first electrically-conductive region having an electrical connection with a second electrically-conductive region.

Also illustrated in FIG. 1A is a heat source 1-50. Heat source 1-50 can be, for example, a heating element, a heat lamp, a light, or the like, as further discussed below, and heat source 1-50 may be positioned such that it heats all, or only a portion of, microfluidic channel 1-11 and/or the content of the channel. As shown in FIG. 1A, heat source 1-50 is positioned such that it is able to heat at least a portion of electrically-conductive region 1-5. A portion of the solder 1-10 in region 1-5 can be heated to a temperature greater than that of the melting point of the solder, thereby causing a portion of the solder 1-12 to become liquid (FIG. 1B). The liquid solder can flow within the microfluidic system such that it contacts at least a portion of the second electrically-conductive region 1-15, and makes an electrical connection 1-60 with the second electrically-conductive region (FIG. 1C). An electrical connection may be formed while one or both of the metals 1-10 and 1-20 is/are liquid. However, the liquid solder can be cooled within the microfluidic system to a temperature less than the melting point of the solder, thereby re-solidifying the solder, and forming a solid electrical connection 1-60 between the first and second electrically-conductive regions.

In some cases, reformation of electrical connections can occur in subsequent steps. For example, if an electrical connection 1-60 similar to the one in FIG. 1C between a first electrically-conductive region 1-5 and a second electrically-conductive region 1-15 is broken, heat may be applied near the broken connection to melt the metal in the first or second electrically-conductive regions to reform the electrical connection 1-60. This process can be repeated as desired.

Formation and/or reformation of electrical connections may be automated according to the present invention. For example, in certain embodiments, a microfluidic network may include one or more sensors (not shown) and heating elements in electrical communication with each other, and embedded into the polymer at different regions along the channel(s). The sensors and heating elements may establish a negative feedback loop with the metal in the channel. For example, a sensor may detect the absence of a metal within the region of the channel in which the sensor is positioned and send a signal to one or more heating elements, causing the heating element(s) to distribute heat locally to that region of the channel. Heat from the heating element(s) may cause the solder in that region to melt and flow in the channel (FIG. 1B), thereby filling the channel and turning off the signal from the sensor.

Figure 2A:
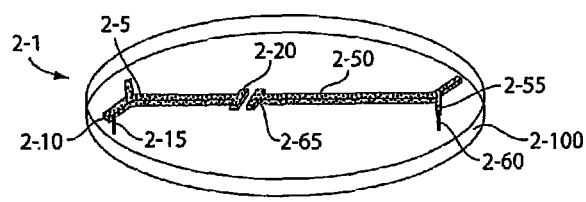
FIG. 2A illustrates a structure comprising a first and a second substantially enclosed microfluidic channels.
Figure 2B:
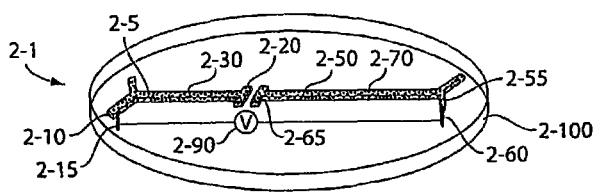
FIG. 2B illustrates a structure comprising a first and a second substantially enclosed microfluidic channels, each of which are filled with electrically-conductive metals.
Figure 2C:
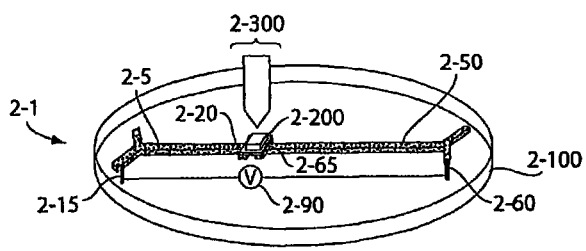
FIG. 2C illustrates a structure comprising an electronic device electrically connected to a first electrically-conductive metal in a first channel, and a second electrically-conductive metal in a second channel.

In another embodiment of the present invention, a method of connecting two electrically-conductive regions within a structure via an electrical component is disclosed, for example, as shown in FIG. 2. In this particular example, a device 2-1 comprises a microfluidic structure 2-100, which can be polymeric or of another material, and which comprises a first substantially enclosed microfluidic channel 2-5 and a second substantially enclosed microfluidic channel 2-50 initially not electrically connected to the first channel (FIG. 2A). As illustrated in FIG. 2A, the first channel may have a first inlet 2-10, a first electrode 2-15 near the first inlet, and a first terminus 2-20 (which can be an outlet). The second channel 2-50 may have a second inlet 2-55, a second electrode 2-60 near the second inlet, and a second terminus or outlet 2-65. As shown in FIG. 2B, the first channel 2-5 is filled with a first electrically-conductive metal 2-30, which is electrically connected to the first electrode 2-15. The second channel 2-50 is filled with a second electrically-conductive metal 2-70, which can be the same as, or different from, metal 2-30. In FIG. 2C, an electrical component 2-200, such as an LED, can be positioned between the first outlet 2-20 of the first channel 2-5 and the second outlet 2-65 of the second channel 2-50, for example, by bridging the two outlets. Electrical component 2-200 can be used to form an electrical connection between the first electrically-conductive metal 2-30 and the second electrically-conductive metal 2-70, e.g., as follows. A heat source 2-300, which can be any energy source external or internal to the device, may be positioned so as to apply energy to the system sufficient to make electrical connection as described below (for example, positioned near outlets 2-20 and 2-65), and may distribute heat to those regions, melting the electrically-conductive metal in outlets 2-20 and 2-65. The liquid metal may then contact the LED to establish an electrical connection with the device between the first electrically-conductive metal 2-30 and the second electrically-conductive metal 2-70. Of course, there can be other electrical connections between first electrically-conductive metal 2-30 and second electrically-conductive metal 2-70. For instance, the first electrode 2-15 and the second electrode 2-60 can be electrically connected to each other via connection to a voltage source 2-90.

Figure 3A:
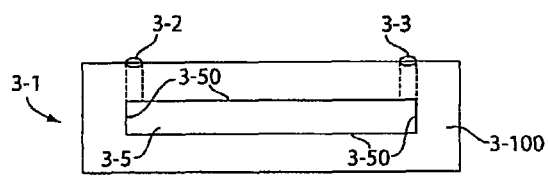
FIG. 3A illustrates a structure comprising a substantially enclosed microfluidic channel.
Figure 3B:
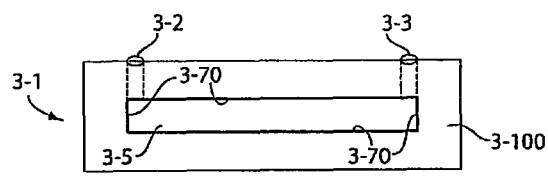
FIG. 3B illustrates the walls of a substantially enclosed microfluidic channel having a chemical deposited thereon, enabling the walls to be wetted by a liquid metal.
Figure 3C:
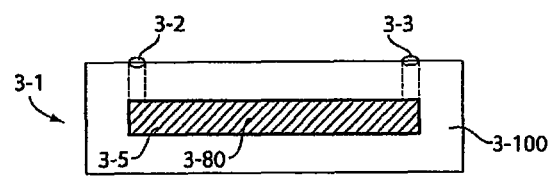
FIG. 3C illustrates a structure comprising a substantially enclosed microfluidic channel filled with a metal.

In another embodiment of the invention, a method of fabricating an electronic connection comprising a metal within a microfluidic system is described, e.g., as shown in FIG. 3. This method includes acts of providing a structure 3-1 defining a microfluidic system. The microfluidic system, in some cases, comprises a substantially enclosed microfluidic channel 3-5. The microfluidic system can be, for instance, a microfluidic channel 3-5 embedded in PDMS 3-100. The microfluidic channel can have ports 3-2 and 3-3, which may be inlets and/or outlets, that enable a liquid to flow into, and out of, the channel 3-5. The microfluidic channel 3-5 can be partially or substantially filled with a metal or, as shown in FIG. 3A, the microfluidic channel 3-5 may be free of a metal. The walls of the microfluidic channel 3-50 are optionally treated by a process such as depositing a layer of a chemical 3-70 onto the walls of the channel, prior to adding a metal into the channel 3-5, as shown in FIG. 313. This process, as described in further detail below, allows the channel to be more readily wetted and enables a liquid, e.g., a liquid metal 3-80, to flow into the channel without spontaneous dewetting of the channel. In some cases, the liquid metal only partially fills the channel 3-5, or as illustrated in FIG. 3C, the liquid metal 3-80 fills the entirety of the cross-section and length of the channel 3-5.

Of course, alternative arrangements to those described above are included within the scope of the invention. For example, the invention can be applied in the context of systems that do not have channels with inlets or outlets per se, but that otherwise define an electrically-conductive pathway through a microfluidic structure that is broken and re-formed as described above, or formed as described above. For example, electrical leads may be embedded within a structure and connected to each other via an electrically-conductive pathway as described above.

In another aspect of the invention, a metal may be positioned so that it can flow into a channel when melted. For example, a first electrode and a second electrode may each be in electrical communication with a substantially enclosed microfluidic channel. A metal may be positioned so that it can flow into the channel when melted, and contact both the first electrode and the second electrode when melted. The metal may be positioned anywhere in the vicinity of the channel so that it can flow into a desired channel when melted, or when melted in conjunction with acts of manipulating the device.

In one embodiment, a mass of solid solder may be situated in a position so that it can flow into a channel when melted, for example, near an inlet of a microfluidic channel. The solder may be caused to flow into at least a portion of the substantially enclosed microfluidic channel by applying heat, for example, locally to an area near the solder using a heating element, such that a temperature greater than the melting point of the solder is applied. The liquid solder may fill the channel by capillary forces, or by the application of pressure or vacuum to the channel, or by any other means. At any point after the liquid solder enters the channel, it may be cooled within the substantially enclosed microfluidic channel to a temperature less than the melting point of the metal, thereby causing the metal to become solid. Subsequent steps of re-melting and/or re-cooling the solder may also be performed.

In another embodiment, a device may comprise a microfluidic system that comprises a first channel in fluid communication with a second channel and a third channel. The second channel may comprise a first outlet and a first electrode situated in the first outlet. The third channel may comprise a second outlet and a second electrode situated in the second outlet. A metal may be contained in the first channel. A heating element may be used to apply heat having a temperature greater than the melting point of the metal, causing the metal to melt into the second channel and third channel. The metal in the second and third channels may form electrical connections with the first electrode and the second electrode. The electrodes may be complete an electrical circuit within the device.

In another embodiment, the metal may be positioned in a chamber adjacent to a channel that is separated from the channel by a valve or barrier. Acts of manipulating the device may include turning the valve, or applying heat to the barrier to melt the barrier, in order to establish fluid communication between the chamber and the channel.

Another aspect of the invention provides a method of self-assembling an electrical device. A self-assembled device is a device that is formed by the process of "self-assembly", defined herein as a spontaneous association of multiple regions of an entity (or entities) into a structural aggregate in which at least two regions of an entity (or at least two regions representing multiple entities) are able to move relative to, and contact, one another without physically any of the regions of the entity (or entities) being contacted with an apparatus external to the entity (or entities). Examples of self-assembly; spontaneous association are described below.

In one embodiment, a method of forming a self-assembled electrical device includes acts of providing a first structural portion comprising a first electrically-conductive region, and providing a second structural portion comprising a second electrically-conductive region. Electrically-conductive regions may include electrically-conductive metals, as defined above, as well as wires, conductive pads, electrodes, and the like. The first and second structural portions spontaneously associate if the first and second portions are caused to move relative to each other from a first configuration to a second configuration by any method that does not require an external apparatus to physically contact either of the first or second portions to bring them into contact with each other. The first and second structural portions can be integral, i.e. two portions of a single structure, or otherwise connected to each other, or can be separate, non-connected components prior to self-assembly. The second, spontaneously-associated configuration can, in some cases, define an electrical connection between the first and second electrically-conductive regions.

For example, if each of the first and second structural portions comprises magnetic elements, an external apparatus that creates a magnetic field may be applied to cause the magnetic elements of the first and second portions to attract one another. Attraction of the magnetic elements of the first and second portions can cause the first and second portions to contact one another. This process is an example of spontaneous association since a magnetic field is used to bring the first and second portions into contact, instead of an apparatus that physically contacts one or both of the portions. Other examples of spontaneous association include attraction by capillary forces, van der Waals forces, electrostatic forces, hydrophilic/hydrophobic forces, and the like. The first and second portions may spontaneously associate under conditions in which at least the first structural portion and the first electrically-conductive region deform significantly during the process of moving, and, in some embodiments, the first electrically-conductive region, which is in a first, more flexible state, converts to a second, more rigid state in the second configuration (or vice versa). Examples of deformation include bending, stretching, constricting, expanding, and the like. "Significant deformation," in this context, means deformation readily ascertainable by a human, with the unaided human eye or via a microscope or the like. For instance, significant deformation of one region of the structural portion can involve, for example, deformation of an essentially linear portion such that at least one portion of the initially linear portion define an angle of at least 2°, 5°, 10°, 15°, 20°, 30°, or a larger angle with another portion of the initially linear portion. Alternatively, significant deformation of a region can involve inducing curvature, stretching or elongation, or contraction or compression such that at least one section is lengthened or shortened in a manner readily ascertainable with the unaided human eye in an amount of, for example, at least 2%, 5%, 10%, 15%, 20%, or greater. In some cases, the first electrically-conductive region changes phase, e.g., from a liquid in the first state to a solid in the second state, causing the region to be more flexible in the first state than the second state.

A variety of definitions are now provided, which will aid in the understanding of the invention. Following, and interspersed with these definitions, is further disclosure, including additional aspects and embodiments, which will more fully describe the invention. "Microfluidic channel system," as used herein, refers to a device, apparatus or system including at least one channel having at least one cross-sectional dimension of less than 1 millimeter (mm).

"Non-fluidically interconnected" fluid flow paths, as used herein, refers to fluid flow paths each comprising one channel or multiple, fluidically interconnected channels, where the channels of different flow paths do not intersect and are physically isolated from each other within the structure so that they can not communicate fluid between each other through bulk mixing of fluid streams.

A "fluid flow path" as used herein refers to one channel or a series of two or more interconnected channels providing a space within the microfluidic structure able to contain fluid or solidified fluid or through which fluid can continuously flow. Each fluid flow path of the structure may include at least one opening thereto able to be placed in fluid communication with the environment external to the microfluidic structure and some embodiments of fluid flow paths include at least two openings able to be placed in fluid communication with the environment external to the microfluidic structure, thus providing an inlet and an outlet.

A "channel" as used herein refers to a flow path or continuous segment of a flow path, which is disposed within one or more levels of the microfluidic network structure and/or penetrates through one or more levels of the microfluidic network structure. "Interconnected channels," as used herein, refers to two or more channels within the structure that are able to communicate fluid between and through each other. A "substantially enclosed" channel, as used herein, refers to any fluid path that is substantially contained and circumscribed by wall(s), except that a substantially enclosed channel can include inlets, outlets, exposed contact regions, and the like. A "non-linear" flow path and/or channel, as used herein, refers to such flow path or channel having a longitudinal axis that deviates from a straight line along its length by more than an amount equal to the minimum cross-sectional dimension of the channel or flow path. A "longitudinal axis" of a channel or flow path as used herein refers to an axis disposed along the entire length of such channel or flow path, which is coextensive with and defined by the geometric centerline of the direction of any bulk fluid which would flow through the channel or flow path should such channel or flow path be configured for fluid flow therethrough. For example, a linear or "straight" channel would tend to have a longitudinal axis that is essentially linear, while a fluid flow path comprising a series of such straight channels that are fluidically interconnected can have a longitudinal axis, comprising the interconnected longitudinal axes of the individual interconnected channels forming the fluid flow path, which is "non-linear." A channel that "lie/lies within" or which is "disposed within," "disposed in," "contained within," or "contained in" a level or multiple levels or layers of a microfluidic structure refers herein to such channel having a longitudinal axis that is coplanar with or, in the case of a level/layer defined by a curved surface, is lying along a contour of the surface, of the level(s)/layer(s) in which it lies or is disposed or contained. A channel that "penetrates," "penetrates through," or "traverses" a level/layer or multiple levels/layers of the structure refers herein to such channel having a longitudinal axis that is non-coplanar with or, in the case of a level defined by a curved surface, is not lying along a contour of the surface of the level(s)/layer(s) such that the longitudinal axis of such channel is non-parallel with any line that can be disposed within the level.

A "multi-level microfluidic network," or "multi-level microfluidic network structure," as used herein refers to a structure capable of containing a fluid, which may be solidified, and/or providing fluid flow therethrough, which includes at least three channels therein, and may contain many more; furthermore, the structure includes at least three channels that are arranged with respect to each other such that there exists no single plane, or curved planar surface, which contains disposed therein the longitudinal axes of the three channels. Such multilevel microfluidic networks, because of their three-dimensionality of structure, are able, for example, to provide channels within the structure having longitudinal axes (defined as the axial centerline of the channel aligned parallel to the direction of bulk fluid flow within the channel) aligned along each of the x, y, and z directional components of space. Such structures are illustrated in FIGS. 4A, 4B, 9, 10A-10F and 13A). The ability to produce microfluidic structures having channels arranged in a multi-level network enables the systems to include therein a plurality of channels providing one or more independent fluid flow paths, where the channels and flow paths can be arrayed in arbitrarily complex geometric networks since the channels of the structures have the capability of crossing over and/or under each other within the structure.

In order for multi-level microfluidic networks to avoid intersection of channels at their points of crossing in the planar projection, there typically are provided at least three identifiable "levels" within the structure: a "lower" level that contains a channel disposed therein that crosses "under" an "upper" level that contains disposed therein a channel that crosses "over" the channel contained in the bottom level, and an intermediate level that isolates the channels of the lower and upper levels and contains connecting channels penetrating therethrough that fluidically connect the channels in the lower level and the channels on the upper level in order to form a fluid flow path comprised of a series of interconnected channels. It should be understood that the terms "lower" and "upper" in the present context are intended to suggest only the relative positions of the various levels of the structure and are not meant to imply any particular orientation of the structure in space. For example the structure can be flipped, rotated in space, etc. so that the "lower" level is positioned above the "upper" level or the levels can be positioned side by side, etc. In yet other embodiments involving flexible structures, the structure can be twisted or bent thereby deforming planar levels into curved surfaces in space such that the "upper" and "lower" levels of the structure may be positioned differently with respect to each other at different locations in the overall structure. In order to produce microfluidic networks with arbitrarily complex channel networks, no additional levels are typically needed because triple, or higher order points in the projection are not necessary to allow the channels within the structure to cross over or under each other and thus cross each other in space without physical intersection of the "crossing" channels within the structure. Further discussion of multi-level microfluidic networks as well as method for their fabrication are disclosed in detail in U.S. Pat. No. 6,645,432, incorporated herein by reference.

A "level" of a structure, as used herein, refers to a plane or curved surface within the structure, typically parallel to a top surface and a bottom surface of the structure, which can have a channel or series of channels disposed therein and/or penetrating therethrough. It should be understood that in the discussion and figures, the microfluidic network structures are often shown as having planar surfaces, such that the levels within the structure are planar; however, many of the structures are fabricated from flexible and/or elastomeric materials that are capable of being bent, twisted, or distorted from the illustrated planar configurations. For such embodiments, the "levels" within the structure will comprise curved surfaces that are parallel to the distorted planar surfaces of the structure, and any discussion herein with regard to "levels" of the structures should be understood to encompass such curved surfaces as well as the planar surfaces illustrated. "Parallel" when used in the context of comparing the topology of two surfaces in space, has its common mathematical meaning referring to the two surfaces being everywhere spaced apart from each other equidistantly.

Structures or devices of the present invention may as noted above, also include one or a plurality of ports, such as inlets and/or outlets, which can receive and/or output a fluid, and can fluidly connect to one or more channels within the structure or device. In one embodiment, an electrically-conductive region such as an electrode can extend through the inlets and/or outlets. In other cases, the inlets and/or outlets may comprise a combination of, or all of, the above. Essentially, the device may have any number of inlets and/or outlets from one to tens or hundreds that can be in fluid communication with one or more electrically conductive regions and/or components.

Microfluidic channel systems useful in various embodiments of the invention can comprise one or more channels or fluid flow paths, and/or a series of channels, some or all of which can be enclosed and some or all of the channels may be interconnected. Channels may lie within the same general plane as one or more levels of the structure, and/or can lie in intersecting planes. Flow paths need not be straight, but can follow a non-linear path such as a curved path, zigzag path, or other path. The channels may have at least one cross-sectional dimension of less than about 1 millimeter (mm) in some cases, less than about 500 microns, less than about 300 microns, less than about 100 microns, less than about 50 microns, less than about 30 microns, less than about 10 microns, less than about 3 microns, or less than about 1 microns in other cases. In certain cases, one or more channels have at least one cross-sectional dimension between about 1 micron and about 100 microns. It should be recognized that shape, aspect ratio and/or the cross-sectional dimensions of each channel can vary with the fluid(s) and the application. The channels can have any suitable cross-sectional shape that allows for fluid transport, for example, a square channel, a circular channel, a rounded channel, a rectangular channel (e.g., having any aspect ratio), a triangular channel, an irregular channel, etc. For example, in one embodiment, the microfluidic channel system comprising at least one layer having a length, a width and a thickness, wherein the thickness of the layer is less than the width of the layer and less than the length of the layer, includes a tall, narrow channel having a thickness greater than its width (e.g. a channel having a thickness of about 80 microns and a width about 50 microns). Similarly, in certain embodiments, such a microfluidic channel system may include at least one channel having a thickness and/or width exceeding its length. Of course, the number of channels, the shape or geometry of the channels, and the placement of channels within the system can be determined by those of ordinary skill in the art. A microfluidic channel system may be fabricated by any method known to those of ordinary skill in the art. Examples include, but are not limited to, methods such as molding, embossing, rapid prototyping, masking techniques, or combinations thereof. For example, a microfluidic channel system can be constructed according to the methods described in U.S. Pat. Nos. 6,719,868; 6,645,432, and 6,686,184, which are hereby incorporated by reference in their entirety. Methods for fabricating microfluidic channels are also described in more detail below in the Examples.

As noted above, some structures or devices of the invention employ microfluidic networks that can include at least one first channel disposed within a first level of the structure and at least one second channel disposed within a second level of the structure. The microfluidic network may be fabricated by any method known to those of ordinary skill in the art as previously described. In one particular embodiment, a device comprising microfluidic channels that are disposed in more than one level can be formed by self-assembly, as described herein.

Figure 4A:
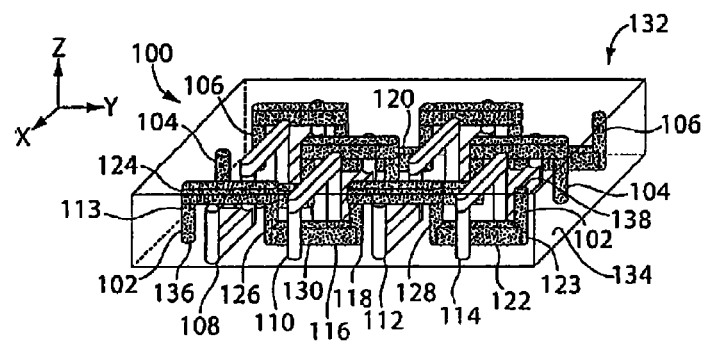
FIG. 4A is a perspective view of a schematic illustration of a multilevel microfluidic network structure having a series of interconnected channels arranged in a "basket weave" configuration with certain channels being filled with a metal.

FIG. 4a illustrates one exemplary embodiment of an essentially infinite number of multi-level microfluidic network structures that can be useful for molding three-dimensional microsolidic structures according to the invention. Microfluidic network structure 100 includes a series of interconnected channels providing seven non-fluidically interconnected fluid flow paths. The channels are arranged in a "basket weave" arrangement. Channel system 100, as illustrated, includes three non-fluidically interconnected fluid flow paths, 102, 104, and 106 arrayed within planes parallel to the y-z coordinate plane, and four non-fluidically interconnected flow paths 108, 110, 112, and 114 arrayed within planes parallel to the x-z coordinate plane. Each fluid flow path of the structure comprises a series of interconnected channels (e.g. fluid flow path 102 comprises interconnected channels 113, 124, 126, 116, 118, 120, 128, 122 and 123 within structure 100). In the illustrated embodiment, flow paths 102, 104 and 106 have been filled with a liquid metal that has been solidified to form multi-level three-dimensional microsolidic wires.

Flow path 102, for example, includes two channels 116 and 122 disposed within the first, lower level of structure 100 and two channels 120 and 124 disposed within the second, upper level of the structure. Flow path 102 also includes a number of connecting channels, e.g. 118, 126, and 128 traversing a third, intermediate level of the structure and interconnecting channels contained in the first, lower level and second, upper level of the structure. The microfluidic network provided by structure 100 cannot be produced by a two-dimensional structure comprising a series of interconnected channels disposed within a single plane or any stack or array of such structures. In other words, network 100 includes channels disposed within the first, lower level of the structure that are non-parallel to channels disposed within the second, upper level of the structure (e.g. channel 116 of fluid flow path 102 and channel 130 of fluid flow path 110).

Fluid flow path 102 of microfluidic network 100 communicates with the external environment through an inlet opening 136 in fluid communication with bottom surface 134 and an outlet opening 138 in fluid communication with upper surface 132. The other fluid flow paths of the network have similar inlet and outlet openings, as illustrated.

The channels of the microfluidic networks provided according to the invention have at least one cross-sectional dimension that does not exceed about 1 mm, in other embodiments does not exceed about 500 µm, in other embodiments does not exceed about 250 µm, in yet other embodiments does not exceed about 100 µm, in other embodiments does not exceed about 50 µm, in other embodiments does not exceed about 20 µm, in other embodiments does not exceed about 10 µm, in other embodiments does not exceed about 5 µm, and in yet other embodiments does not exceed about 1 µm. A "cross-sectional dimension," when used in the above context, refers to the smallest cross-sectional dimension for a cross-section of a channel taken perpendicular to the longitudinal axis of the channel. In certain embodiments, at least some of the channels will have a length substantially exceeding their minimum cross-sectional dimension; for example by a factor of at least about 10, 50, 100, 500, 1000, 5000, or 10,000 or more. While the channels of network 100 have cross-sectional dimensions that are essentially equal to each other, in other embodiments, the channels can have unequal cross-sectional dimensions, and some channels can have depths within the structure sufficiently great so that they are disposed in two or all three levels of the structure, instead of being disposed in only a single level, as illustrated. In addition, while in network 100 the channels are straight and linear, in other embodiments the channels can be curved within the level(s) in which they are disposed.

Figure 4B:
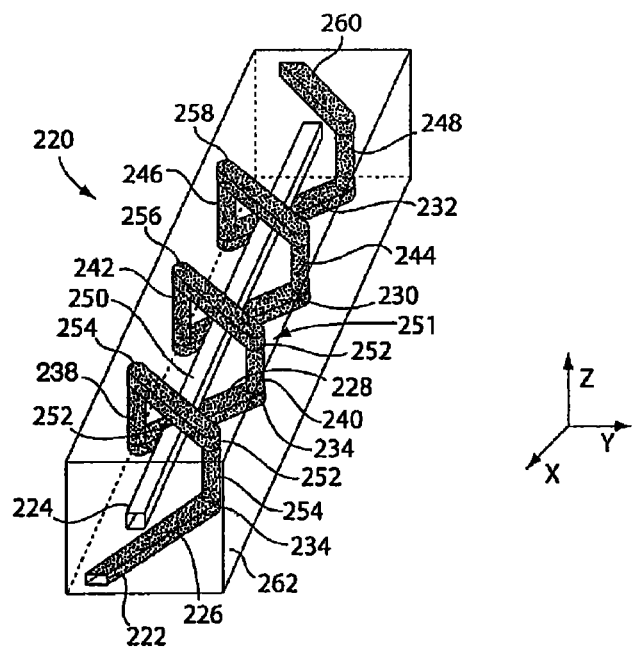
FIG. 4B is a perspective view of a schematic illustration of a five-level microfluidic network comprising a centrally disposed straight channel surrounded by a coiled fluid flow path filled with a metal.

FIG. 4B illustrates one embodiment of a multi-level microfluidic structure, useful for forming a coil heater molded microsolidic structure according to the invention (see Example 13), including therein three levels having channels disposed therein such that their longitudinal axes are coplanar with each of the levels, and a total of five levels overall. Structure 220 includes a microfluidic network comprising a fluid flow path 222 arranged as a coil surrounding a second fluid flow path 224. Such an arrangement may be especially useful for particular microfluidic applications involving, for example, heat transfer or mass transfer between components contained within fluid flow paths 222 and 224, or for embodiments where electrical, magnetic, optical or other environmental interaction between materials in the respective flow paths is desired. In the illustrated embodiment, coiled flow path 222 has been filled with a liquid metal that has been solidified to form a multi-level three-dimensional microsolidic wire coil.

The first, lower level of structure 220 includes disposed therein channels 226, 228, 230, and 232 of coil flow path 222. The second level from the bottom of structure 220 includes disposed therethrough the lowermost region 234 of connecting channels 236, 238, 240, 242, 244, 246, and 248 of fluid flow path 222. The third level from the bottom of structure 220 includes channel 250 of fluid flow path 224 disposed therein and also includes intermediate region 251 of the connecting channels. The fourth level from the bottom of structure 220 includes, traversing therethrough, upper regions 252 of the connecting channels, and the uppermost level of structure 220 includes disposed therein channels 254, 256, 258 and 260 of flow path 222.

A structure useful for supporting channels may comprise any shape or material that is suitable according to the present invention. For example, a structure can be in the form of a block, a membrane, a tube, and the like. In one embodiment of the invention, a polymeric structure is used. In another embodiment, a flexible structure is used. In yet another embodiment, the microfluidic channel system comprises an elastomeric structure is used. In one particular embodiment, the elastomeric structure comprises PDMS. In some cases, the structure comprises a material that is thermally or electrically insulating. In other cases, the structure comprises a material that is thermally stable, e.g., it does not substantially melt, decompose, or deform its shape when in contact with an electrically-conductive material, when heat is applied to the structure in order to melt the electrically-conductive material, and/or when a current is applied to the electrically-conductive material. A structure may also comprise a material with any combination or all of these attributes.

Figure 6:
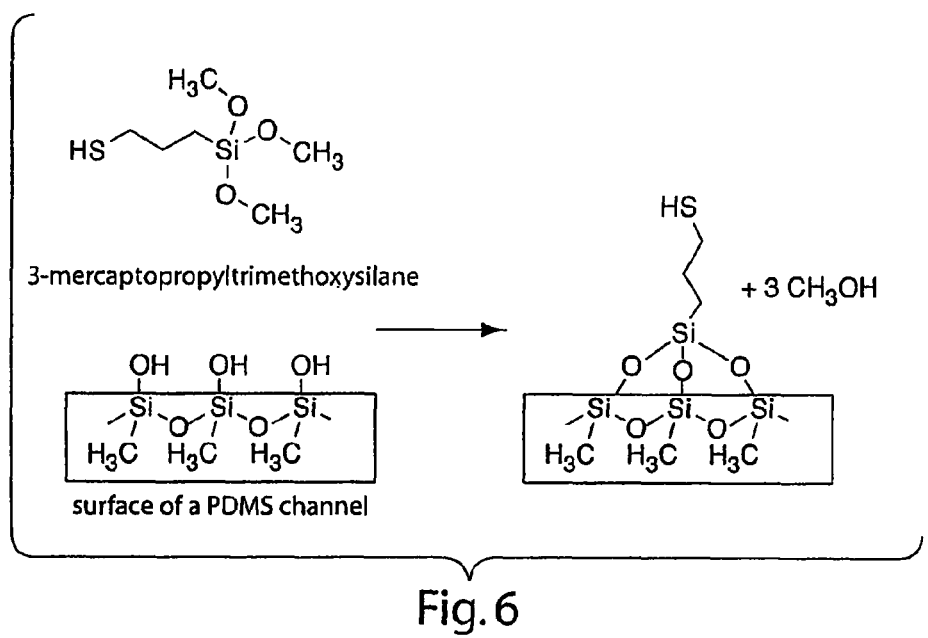
FIG. 6 is a schematic diagram showing the chemical structure of a silane utilized in certain embodiments to treat the PDMS surfaces of microfluidic channels and the structure of the silane when chemically bonded to the surface of the microfluidic channel.

A structure comprising one or more channels, such as a microfluidic channel or channels, can be patterned physically and/or chemically in order to minimize the surface free energy at the interface between a material that flows within the channel, such as an electrically-conductive metal and the walls of the channel, where an electrically-conductive metal is described as a material within a channel in the disclosure herein, it is to be understood that other materials can be substituted and that this term is simply for purposes of illustration. The walls of the channel can be patterned using any technique that allows an electrically-conductive metal to flow into and/or through the channel and where the walls may prevent spontaneous dewetting of the channel. Such a technique, in some cases, can involve depositing onto the walls of the structure one or more chemicals that are different from the chemical makeup of the structure. A technique that alters the chemical or physical properties of the walls of the channel can also be employed. It is noted that different chemicals and/or methods of wetting a channel can be used depending on the chemical and/or physical properties of the metal to be flowed in the channel and the chemical and/or physical properties of the walls of the channel. For example, in one embodiment, a microfluidic channel in a structure comprising PDMS is altered by flowing a solution of an alkanethiol, such as octadecanethiol in ethanol, into the channel, thereby depositing a layer of the alkanethiol onto the walls of the channel. The alkanethiol can be covalently bonded, or physically adsorbed, to the walls of the channel depending on the technique employed. Any chemical that sufficiently coats the channel may be used. The alkanethiol can also be deposited continuously along the channel, or discontinuously in discrete portions of the channel. Similarly, instead of or in addition to an alkanethiol, in certain embodiments a thin metal layer, e.g. gold, may be deposited onto a surface of a channel. In certain preferred embodiments, the surface is coated with a silane, such as 3-mercaptopropyltrimethoxysilane (see Example 3 and FIG. 6).

Regions that preferentially wet a metal are referred to herein as "wetting regions"; regions that do not preferentially wet a metal are referred to as "non-wetting regions." More than one chemical may also be deposited in the channel, such that a first chemical wets the metal more preferentially than does a second chemical. These chemicals may be deposited such that certain parts of the channel wet the metal more preferentially than other parts of the channel.

As noted, in one embodiment of the invention, an electrically-conductive material can be provided in a channel of a structure of the invention, and can be selected to be a material that can flow under certain conditions and is solid under other conditions. For example, a material that will flow at a first-higher temperature and will exist in a solid state at a second, lower temperature. In some embodiments, this material comprises a metal that is solid at room temperatures, but is liquid at easily accessible elevated temperatures (i.e., a "low melting point" metal). A "low melting point metal" as used herein generally refers to a metal having a melting point between the range of about 30 degrees Celsius (° C.) and about 900 degrees Celsius (° C.); in some cases, a low melting point metal may have a melting point between the range of about 30 degrees Celsius (° C.) and about 700 degrees Celsius (° C.); in other cases, the metal can have a melting point between the range of about 30 degrees Celsius (° C.) and about 500 degrees Celsius (° C.); in some cases, the metal can have a melting point between the range of about 30 degrees Celsius (° C.) and about 400 degrees Celsius (° C.); in some cases, the metal may have a melting point between the range of about 30 degrees Celsius (° C.) and about 330 degrees Celsius (° C.); and in some cases, the metal may have a melting point between the range of about 50 degrees Celsius (° C.) and about 200 degrees Celsius (° C.). In other embodiments, an electrically-conductive metal may comprise a first metal that is a low melting point metal and a second metal that is not a low melting point metal, as long as at least a portion of the first metal can flow in at least a portion of a fluid flow path within a microfluidic channel system when the first metal is in liquid form.

In some instances, the electrically-conductive metal comprises a low melting point metal such as solder, or a solder alloy. For example, in one embodiment, a low melting point metal can comprise one of indium (In), tin (Sn), silver (Ag), lead (Pb), bismuth (Bi), cadmium (Cd), zinc (Zn), or antimony (Sb). In another embodiment, a low melting point metal may comprise a combination of two or more of the metals listed above. For instance, the metal may comprise one of the following non-limiting combinations of metals in any compositional percentage: tin and indium; indium and silver; tin, lead, and silver; tin and silver; tin and lead; and indium and lead. Examples of solder include, but are not limited to, solders such as various alloys of tin and lead, for example, 50% Sn/50% Pb, 60% Sn/40% Pb, etc. Other solders may include other metals in addition to tin and/or lead, for example, bismuth, cadmium, tin, indium, zinc, antimony, copper, silver, gold, etc. Specific non-limiting examples of solder include 45% Bi/23% Pb/8% Sn/5% Cd/19% In (melting point of about 47° C.), 50% Bi/25% Pb/12.5% Sn/12.5% Cd (melting point of about 70° C.), 48% Sn/52% In (melting point of about 118° C.), 42% Sn/58% Bi (melting point of about 138° C.), 63% Sn/37% Pb (melting point of about 183° C.), 91% Sn/9% Zn (melting point of about 199° C.), 93.5% Sn/3% Sb/2% Bi/1.5% Cu (melting point of about 218° C.), 95.5% Sn/3.5% Ag/1% Zn (melting point of about 218° C. to about 221° C.), 99.3% Sn/0.7% Cu (melting point of about 227° C.), 95% Sn/5% Sb (melting point of about 232° C.-240° C.), 65% Sn/25% Ag/10% Sb (melting point of about 233° C.), 97% Sn/2% Cu/0.8% Sb/0.2% Ag (melting point of about 226° C.-228° C.), 77.2% Sn/20% In/2.8% Ag (melting point of about 187° C.), 84.5% Sn/7.5% Bi/5% Cu/2% Ag (melting point of about 212° C.), 81% Sn/9% Zn/10% In (melting point of about 178° C.), 96.2% Sn/2.5% Ag/0.8% Cu/0.5% Sb (melting point of about 215° C.), 93.6% Sn/4.7% Ag/1.7% Cu (melting point of about 217° C.), or LMA-117 (melting point of about 45° C.). Certain preferred solder compositions are listed below in Table 2. The low melting point metal may be chosen by those of ordinary skill in the art to have a suitable melting temperature that can be flowed in a microfluidic channel, for example, with a knowledge of melting points, eutectic properties, etc.

Thus, an electrically conductive material can exist in liquid form at certain time in processes of the invention. "Liquid", as used herein, is defined by the property of being able to flow and can include a material that is in the liquid state (i.e., not a solid or a gas), as well as particles and/or particles that may be in the solid state but that are able to flow. When a temperature above the melting point of the bulk of a solid metal for example, where a metal is used is applied to the metal, or when heat is applied only to a portion of the metal, all, or only a portion of the metal may melt, but particles, aggregates, impurities, other entities within the metal, or other parts of the metal, some of which may have a melting point higher than the temperature applied, can remain in solid form. As long as at least a part of the electrically-conductive metal can flow in at least a portion of a microfluidic channel, the electrically-conductive metal may be considered "liquid" and be used in accordance with the present invention.

An electrically-conductive material such as a metal within the microfluidic channel system may at least partially define an electrically-conductive region. In some instances, a metal acting as a conductive wire may define the electrically-conductive region. In another embodiment, a microfluidic channel system comprises at least a first electrically-conductive region and a second electrically-conductive region that electrically connects to the first region. At least the first of the two regions comprises a low melting point metal in some instances. The second electrically-conductive region can comprise the same or a different low melting point metal than the metal of the first region, or the second conductive region can comprise a non-low melting point metal. Non-limiting examples of electrically-conductive, non-low melting point metals include copper (Cu), platinum (Pt), palladium (Pd), gold (Au), nickel (Ni), etc. In another embodiment, a microfluidic channel system can comprise a plurality of electrically-conductive regions, in which at least one of the regions comprises a low melting point metal. For example, a channel may comprise three or four electrically-conductive regions, at least one of which comprises a low melting point metal. In another embodiment, a channel may comprise five or a six electrically-conductive regions, at least one of which comprises a low melting point metal. In another embodiment, a channel may comprise tens, hundreds, or even thousands, of electrically-conductive regions, at least one of which comprises a low melting point metal.

Two electrically-conductive regions having an "electrical connection" means that a current can be passed from the first region to the second region without a substantial decrease in magnitude of the current (i.e., having negligible additional resistivity as compared to the resistivity of the higher resistivity of the two electrically-conductive regions). Thus, for a first electrically-conductive region that is not electrically connected to a second electrically-conductive region, a first current can flow within the first region and a second current can flow within the second region, but a current cannot pass from the first region to the second region.

In some cases, electrical connections can be formed between electrically-conductive regions by melting at least a portion of a low melting point metal in a first electrically-conductive region; the metal may flow and contact the second electrically-conductive region, which may or may not comprise a low melting point metal. Methods for flowing a fluid, e.g., a liquid metal, are discussed below. Upon contact of the first and second electrically-conductive regions, an electrical connection is formed between the first and the second electrically-conductive regions. In some embodiments, the electrically-conductive regions are present within a microfluidic channel system. At least a portion of the first electrically-conductive region can form an electrical connection with at least a portion of the second electrically-conductive region; i.e., the whole cross-section of a channel does not have to be filled with an electrically-conductive metal in order to form an electrical connection between the two regions. For instance, the metal can have various shapes and/or configurations in the channel when the metal forms the electrical connection, e.g., the metal may only fill at least a cross section of a portion of the channel. In another example, a metal can flow and conform to the shape of the channel. In some cases, the metal may be held or confined within the channel or a portion of the channel in some fashion, for example, using surface tension (i.e., such that the metal is held within the channel within a meniscus, such as a concave or convex meniscus). In other cases, a metal can flow continuously along only a portion of a channel, for example, along one wall of the channel such that the channel is only partially filled.

The metal can fill a channel to any degree. For instance, the metal may substantially fill the channel such that more than 50%, more than 70%, or more than 90% of the volume of the channel is filled. The metal can even completely fill the channel. In other instances, the metal may fill only a portion of the channel such that less than 50%, less than 30%, or less than 10% of the volume of the channel is filled.

For example, if a chemical such as a wetting agent is deposited in discrete portions or segments of the channel, the metal may preferentially wet those segments comprising the chemical, thereby forming plugs of metal in the channel. Thus, segments of, for example, metal/non-metal/metal/non-metal may be formed in the channel. This may be a method of forming distinct electrically conductive regions within the channel. More than one chemical may also be deposited in the channel, such that a first chemical wets the metal more preferentially than does a second chemical. These chemicals may be deposited such that certain parts of the channel wet the metal more preferentially than other parts of the channel. For example, the first chemical may be deposited at the junction and along a first region of a flow path in the form of a "Y" shape; the second chemical may be deposited at the junction and along the second region of the channel. When a metal is flowed into the flow path, it may wet the first chemical preferentially over the second chemical, and therefore flow into the first region comprising the first chemical. When the first region is filled, and more pressure is added to flow the liquid metal, the second region may be filled.

There are many methods of causing a fluid to flow. For instance, melting a metal from a solid to a liquid, or melting the metal in conjunction with acts of manipulating the device, may cause a liquid metal to flow. Acts of manipulating include any energy or force that is applied to the system, which aids the flow of the metal from a first position to a second position. In one embodiment, the fluid metal flows by pushing the fluid metal through a channel. Fluids can be pushed by applying a pressure using, for example, gravity, a pump, syringe, pressurized vessel, or any other source of pressure, to a channel comprising the fluid metal. In another embodiment, a metal may flow due to a vacuum or a reduced pressure that is applied to a port, such as an outlet, of a channel comprising the metal. Vacuum can be provided by any source capable of providing a lower pressure condition than exists upstream of the metal. Such sources include vacuum pumps, venturis, syringes, evacuated containers, etc. In another embodiment, the mechanical structure can be altered to cause the metal to flow. For example, in one particular embodiment, a pressure may be applied to the structure containing the channel by pushing down on the structure uniformly or non-uniformly. In another embodiment, acts of bending or folding the structure may change the shape of the channel at the position where the channel is bent or folded, and cause the cross-section of the channel to be constricted at that position. This can cause the fluid in the channel to flow away from the area of high pressure and into an area of lower pressure. A combination of acts of manipulation can also be employed in order to cause a liquid metal to flow and to form electrical connections. In yet other embodiments, the structure may be sonicated to facilitate the flow of liquid metal in the channels.

In one aspect of the invention, electrical connections may be formed between electrically-conductive regions within channels via a connection exterior to the channels. For example, in one embodiment, a microfluidic channel system comprises a first microfluidic channel that is near, but not in fluid communication with, a second microfluidic channel. The first channel may comprise a first inlet, a first outlet, and a first electrically-conductive metal between the inlet and the outlet. The second channel may comprise a second inlet, a second outlet, and a second electrically-conductive metal between the inlet and the outlet. A first electrode, which may be any conductor having any size, shape, or composition so long as it is capable of forming an electrical connection with an electrically-conductive region, can be placed in electrical connection with the first metal in the first inlet; a second electrode can be placed in electrical connection with the second metal in the second inlet. The first and second electrodes can be electrically connected to each other, for instance, outside of the device, for example, by connection of each to a power source. Of course, electrodes can be positioned in an electrical communication with the various conductive materials at any location and this need not be the case at the inlets exclusively. A first temperature above the melting point of the first metal can be applied near the first outlet of the first channel, thereby causing the first metal to melt in that region. A second temperature above the melting point of the second metal may be applied near the second outlet of the first channel, thereby causing the second metal to melt in that region. An electrical connection can be formed between the first liquid metal in the first outlet and the second liquid metal in the second outlet by placing an electrical component between the first and the second outlet, such that it makes electrical connections with the first and second metals. An electrical component can also make more than two electrical connections with more than two channels of a structure. In one embodiment, a plurality of connections may be made in parallel by applying a temperature higher than the melting temperature of a metal to an entire structure that contains a plurality of channels comprising the metal. Examples of an electrical component include a LED, a transistor, a diode, and many others.

In certain embodiments, a break in an electrical connection between a first and a second electrically-conductive region may occur, such that the break causes a substantial decrease in the magnitude of a current that is passed (including even an absence of a current signal), from the first region to the second region in response to a potential applied between the two regions. A break in electrical connection may occur because of various reasons, including normal use of a device comprising the first and second electrically-conductive regions, or if excessive force is applied to the device, for example, if the device is dropped, bent, or distorted by any other means. The break in the electrical connection can be reformed, in accordance with the invention, as follows. The regions on either sides of the break may be designated as first and second regions. The break can be reformed by melting a metal in the first region, and/or the metal in the second region, where the metal is a low melting point metal as defined above. As discussed in further detail below, a temperature higher than the melting point of the low melting point metal in the first region can be applied to melt the metal; melting may cause at least a portion of the metal to flow towards the second region. The metal may contact at least a portion of the second region and reestablish an electrical connection with the second region. The metal can be cooled to a temperature lower than the melting point of the metal. A reestablished electrical connection may have a similar magnitude of current that passes from the first region to the second region, relative to the current between the regions before the break occurred.

A metal can be melted by any method known to those of ordinary skill in the art. For example, a metal can be melted by the application of heat to the metal until the metal has a temperature greater than the melting point of the metal. In one embodiment, heat may be applied locally near an electrically-conductive region. In one particular embodiment, heat may be applied directly to a metal. In a second particular embodiment, heat can be applied indirectly to a metal by heating the structure that the metal is contained in at a position near the first electrically-conductive region. In some instances, applying heat indirectly to the structure near the first electrically-conductive region causes heat to be transferred to the first metal. If the heat that is transferred to the first metal is able to heat the metal to a temperature that is greater than the first melting point of the first metal, the first metal may melt completely or incompletely. Heat can be applied to the structure indirectly by various methods, such as by placing a heat source near, but not in direct contact with, the first electrically-conductive region. For example, in one embodiment, a solder gun is placed in contact with the structure near the first electrically-conductive region. The solder gun heats the structure and the metal within the first electrically-conductive region, and melts at least a portion of the metal in the first electrically-conductive region. In another embodiment, a metal may be melted by applying heat to the whole structure comprising the microfluidic channel system. Heat can also be applied to the structure indirectly by various methods, such as by placing the structure in an oven, on a hot plate, in a hot fluid bath, under a heat lamp or a light, or by other methods. In another arrangement, one or more regions can be heated by the passage of electrical current through the regions. For example, where an electrical flow path of relatively low resistivity exists but is broken or otherwise caused to experience an increase in resistivity, but where some current can still flow, passing electrical current through the flow path can heat the flow path, especially at the region where a partial or full break occurred due to increased resistivity especially at the partially-broken portion. This can cause an electrically-conductive material such as a metal to flow and re-form the connection, lowering resistivity and repairing the device. Alternatively, a heating element may be embedded within the structure near a region of one or more channels comprising the an electrically conductive region. Applying heat directly or indirectly to a first region/channel may cause the metal to melt; the same heat applied may or may not cause metal to melt in other regions/channels, depending on the size/spacing/energy output of the heating element. The metal may be melted to varying degrees, depending on the use and application of the device. For instance, in one embodiment, a metal can be melted completely, i.e., until the metal is completely liquid; in another embodiment, the metal may be melted incompletely, i.e., until only a portion of the metal is liquid.

In another embodiment, a structure comprising a microfluidic channel system comprises at least a first electrically conductive region comprising a first metal having a first melting point, and a second electrically conductive region comprising a second metal having a second melting point. The first melting point may be lower than the second melting point; therefore, if a temperature between the first and second melting point is applied to the whole structure, only the first metal in the first electrically conductive region will melt. Heat may be applied to the structure indirectly by various methods, such as by placing the structure in an oven, on a hot plate, in a hot fluid bath, or by other methods.

As described herein, there are many techniques that can be employed for melting a metal. In some instances, it can be useful to apply heat to a metal, melt the metal, and allow the metal to flow into a channel. It may be desirable to form an electrical connection between an electrically-conductive region outside of a channel (e.g., an electrode) and an electrically-conductive region inside the channel. In other instances, it can be useful to apply heat to a metal outside a channel, melt the metal, and allow the metal to flow inside the channel. Sometimes, it is desirable to form electrical connections between a first and a second electrically-conductive region inside the channel. In other cases, it may be desirable to apply heat to a metal, melt the metal, and allow the metal to flow out of a channel. This can be useful for applications for forming electrical connections with electrical components, or other entities, outside of the structure comprising the microfluidic channel system.

In some instances, it is desirable to melt a metal and direct it from a first portion of a first channel to a second portion of the first channel, to a second channel, and/or to the exterior of the first or second channels via an outlet, by applying heat indirectly to one end of the metal in the channel. For example, in one embodiment, a first end of a metal in a first portion of a channel can be heated indirectly by a heat source. Since the heat is applied locally, only the end of the metal is able to flow. The metal may flow only as long as a heat source applies heat to the vicinity of the metal, i.e., if heat is removed, the metal may solidify. Thus, the metal can be directed to a second portion of the first channel by heating discrete portions of the metal along a pathway connecting the first portion and the second portion of the channel; in some instances, electrical connections can be formed by this method.

In one embodiment, a structure may comprise a microfluidic channel or flow path comprising at least a first electrically conductive region and a second electrically conductive region in the channel, wherein the first and second electrically conductive regions are not in electrical communication with each other, and wherein at least the first region comprises a first electrically conductive metal. A series of sensors and heating elements may be in electrical communication with each other, and placed in the structure at different regions along the channel. The sensors and heating elements may establish a negative feedback loop with the metal in the channel. For example, a sensor may detect the absence of a metal within the region of the channel in which the sensor is positioned and send a signal to one or more heating elements, causing the heating element(s) to distribute heat locally to that region of the channel. Heat from the heating element(s) may cause the solder in that region to melt and flow in the channel, thereby filling the channel and turning off the signal from the sensor. Similarly, a series of sensors and cooling elements may be in electrical communication with each other, and placed in the structure at different regions along the channel. The sensors and cooling elements may establish a negative feedback loop with the metal in the channel. For example, a sensor may detect a high temperature in a region of the channel where it is situated and send a signal to one or more cooling elements, causing the cooling element(s) to cool locally that region of the channel. This cooling may cause at least a portion of the metal in that region of the channel to solidify. Detection of a certain low temperature in that same region may cause the sensor to turn off its signal for cooling. Thus, heating the first electrically conductive metal and allowing the metal to flow and make an electrical connection with the second electrically conductive region may be performed automatically using a series of sensors and heating and/or cooling elements that are connected to the device. In other words, the forming and reforming of electrical connections may be automated according to the present invention.

In some instances, melting a metal alone may not cause it to flow within channels of a microfluidic network structure, but applying additional energy to the structure may cause the metal to flow. For example, in one embodiment, a structure comprising a microfluidic channel system may comprise at least a first electrically conductive region comprising a first metal having a first melting point, and a second electrically conductive region comprising a second metal having a second melting point. The first and second electrically conductive regions may be aligned with regions on the wall of the channel that wet the metal (wetting regions). The first and second electrically conductive regions may be separated by a gap in the channel; the gap may be aligned with a region on the wall of the channel that does not wet the metal (non-wetting region). Applying heat having a temperature above the melting points of the first and second melting points may cause the first and second metals to melt. Due to the favorable surface free energy of the wetting regions, the metals may not flow into the gap. If an energy greater than the energy of the metal/gap interface is applied, however, the first or second metals may flow into at least a portion of the gap. This energy may be in the form of a deformation energy, e.g., bending the channel structure may constrict a portion of the channel and may cause the first or second liquid metals inside the channel to flow into at least a portion of the gap. The energy may be in the form of a magnetic energy, e.g., if magnetic particles are suspended in the first liquid metal, applying a magnetic field to the first metal may cause the first metal to flow into at least a portion of the gap. The energy may be in the form of a vibration or sound energy (e.g. sonication). Of course, other appropriate methods for applying an energy to the system in order to overcome the surface free energy of the metal/gap interface can be determined by those of ordinary skill in the art.

In certain embodiments of the present invention, a metal may be positioned so that it can flow in a first microfluidic channel when melted. The metal may be positioned anywhere in the vicinity of the first channel so that it can flow into the first channel when melted, or when melted in conjunction with acts of manipulating a microfluidic structure. A combination of acts of manipulation may also be employed. Acts of manipulating include any energy or force that is applied to the system, which aids the flow of the metal from a first position to a second position. The first and/or second positions are not limited to being inside a channel. For example, in one embodiment, a metal may be situated outside of the first channel. A tube that is external to the structure may be filled with the metal; the metal may be melted while inside the tube, the tube may be inserted into an inlet of the first channel, and a pressure may be applied to the tube so that the metal flows into the first channel. In another embodiment, a metal may be situated on top of the structure comprising the first channel, and near an inlet of the first channel. The metal may be situated on top of the inlet. Melting the metal may cause it to flow into the first channel via the inlet by gravity. Applying a vacuum to an outlet of the first channel may aid the flow of the metal into the channel.

In the examples above, the microfluidic structure may have any configuration that aids the flow of the metal into channels of the structure when the metal is melted. For example, the structure may have a sloped surface leading up to an inlet so that the metal will flow into the inlet by gravity when the metal is melted. The inlet may comprise an opening having a diameter much greater than the diameter of the channel so that the metal enters the inlet easily. Portions of the structure may be patterned with a chemical that preferentially wets the metal so that the metal will flow along the patterned regions when melted, and into the channel(s). In all cases, a channel may be filled completely or partially, depending on the application of the device.

At any point, a liquid metal may be cooled by exposing the metal to a temperature less than the temperature of the metal in order to solidify the metal. The metal can be solidified completely, i.e., such that the metal is completely solid, or a metal can be solidified incompletely, i.e., such that only a portion of the metal is solid, depending on the intended use of the device. A metal may be cooled directly or indirectly. Any method for decreasing the temperature of the metal below the melting point of the metal can be determined by those of ordinary skill in the art. These steps of melting/cooling/melting/cooling, etc., may also be performed any number of times.

Another aspect of the invention provides a method of forming a self-assembled structure. The method may comprise steps of providing a component comprising a structural element, and allowing the component comprising the structural element to deform significantly from a first shape to a second shape under conditions in which the first structural element is in a first, more flexible state. "Significant deformation" or "deformed significantly" is defined above. A component can be any unit that is part of the final assembled structure. A "structural element" may be any unit that provides at least a portion of the structural integrity of the final assembled structure. In one embodiment, the structural element may be contained in the component. For example, the structural element can be a wire that is embedded in a flexible planar component.

Both the component and the structural element may deform significantly; however, they may deform significantly in similar or dissimilar ways. Examples of deformation include bending, stretching, constricting, expanding, and the like. In one embodiment, the structural element can change phase (e.g., from a liquid to a solid) from the first state to the second state, causing it to be more flexible in the first state than the second state. Deformation of the component from the first shape to the second shape may occur without physically contacting the component with an external apparatus to urge the component into the second shape. In other words, deformation can occur with the aid of an external apparatus, as long as the external apparatus itself does not physically contact the component. For example, an external apparatus that does not physically contact the component can be an apparatus that imparts a magnetic field to the component, or a heat source that warms the temperature of an area surrounding the device. Deformation may occur by spontaneous association of components, or parts of a component, by forces that include, but are not limited to, magnetic, capillary, hydrophobic/hydrophilic, van der Waals, or electrostatic forces.

At least a portion of the final assembled device may be more rigid than the unassembled component(s). For example, in one embodiment, the components or portions of a component may have more degrees of freedom of movement in the unassembled state than in the assembled state.

In some instances, the assembled device comprises more functionality than the unassembled component(s). For example, in one embodiment, electrical connections between components may exist after self assembly, e.g., electrical connections may be made upon assembly of the components. Electrical connections can be made between a first component comprising a first structural element, the first structural element being a first microfluidic channel that comprises a first electrically-conductive region, and a second component comprising a second structural element, the second structural element being a second microfluidic channel comprising a second electrically-conductive region, as described previously in one embodiment of this invention. The first or second components can comprise a flexible material, such as PDMS. At least a portion of the first and second electrically-conductive regions may comprise a liquid metal, such as solder, in the first unassembled state, allowing the structural element to be flexible. In the second assembled state, the assembly can be cooled to a temperature below the melting point of the liquid metal to solidify the metal. Solidifying the metal can also cause electrical connections to be formed between components of the assembly. If an electrical connection of the device is broken, it may be reformed by melting the metal, re-forming the electrical connection, and cooling the metal.

In another arrangement, a self-assembly technique involves joining previously unjoined components and/or deforming a component from a first shape to a second shape, without external stimulus contacting the component, by softening at least a portion of the component, allowing that portion to deform, and then hardening the component where a known new electrical connection is formed. In embodiments where a new electrical connection is formed, the resulting device after self-assembly may be part of, or may define a functional electrical device including a power source, electrical circuitry, and a component that moves upon electrical stimulus and/or emits a signal, such as light or a sound, under an electrical stimulus, or other function associated with known or developed electrical circuitry.

In another embodiment, a structure may comprise a component that comprises at least a first structural element. The first structural element may include at least a first electrically-conductive region in a microfluidic channel. The structure can be in the form of a planar layer, and may comprise a flexible material such as PDMS. The planar layer can be deformed, such as by folding, twisting, bending, coiling, etc., into a three-dimensional structure. Electrical connections can be formed between the first and the second channels, which may, for example, constitute a three-dimensional electrical network. If an electrical connection of the device is broken, it can be reformed by melting the metal, re-forming the electrical connection, and cooling the metal, e.g., as described above.

An example of a procedure for fabricating a microfluidic channel in a structure is now described. It should be understood that this is by way of example only, and others of ordinary skill in the art will know of additional techniques suitable for forming microfluidic structures, for instance, as discussed in U.S. Pat. Nos. 6,719,868, 6,686,184, and 6,645,432, each of which is incorporated herein by reference. In one embodiment, a microfluidic channel may be made by applying a standard molding article against an appropriate master. For example, microchannels can be made in PDMS by casting PDMS prepolymer (Sylgard 184, Dow Corning) onto a patterned photoresist surface relief (a master) generated by photolithography. The pattern of photoresist may comprise the channels having the desired dimensions. After curing for 1 h at 65° C., the polymer can be removed from the master to give a free-standing PDMS mold with microchannels embossed on its surface. Inlets and/or outlets can be cut out through the thickness of the PDMS slab. To form substantially enclosed microchannels, the microfluidic channels may be sealed in the following way. First, the PDMS mold and a flat slab of PDMS (or any other suitable material, such as a glass slide) can be placed in a plasma oxidation chamber and oxidized for 1 minute. The PDMS structure can then be placed on the PDMS slab/glass slide with the surface relief in contact with the slab. The irreversible seal is a result of the formation of bridging siloxane bonds (Si—O—Si) between the two substrates that result from a condensation reaction between silanol (SiOH) groups that are present at both surfaces after plasma oxidation. Such procedure is described in more detail below in the context of Examples 3 and 6.

The following examples are intended to illustrate certain embodiments of the present invention, but do not exemplify the full scope of the invention.

EXAMPLE 1

Fabrication of an LED Device Using a PDMS Microfluidic Structure

A structure comprising a first and a second microfluidic channel, not in electrical connection with each other, was fabricated using PDMS. The channels were filled with a 0.01 mM solution of octadecanethiol ($HS(CH_2)_{17}CH_3$); the solution was then removed from the channels, which resulted in a layer of octadecanethiol deposited on the walls of the channel. This layer of octadecanethiol enabled the walls of the channel to be wetted by a liquid metal in a later step. An LED was placed between the outlets of the two channels such that the terminals of the LED bridged the two channels. The channels were then filled with a clean low-melting solder alloy (e.g., LMA-117; the solder was unoxidized and kept under water at pH 1 prior to use). Once inside the channel, the solder was manipulated from the outside by melting it with a warm soldering iron. The solder was moved and redirected in the channel using the soldering iron. Gentle heating and/or pressure with the soldering iron forced small drops of solder out of the channels and into contact with the terminals of the LED, which electrically connected the LED to the electrically-conductive regions of the channels. The solder was allowed to cool and become solid. A first electrode was then electrically connected to the solder within the first channel and a second electrode was electrically connected to the solder within the second channel. The first and second electrodes were then connected to a power supply. When the power supply was turned on, the LED became lit.

The structure was then mechanically bent, breaking one of the solder regions in the first channel, thereby breaking an electrical connection of the device. The LED could not be lit afterwards when the first and second electrodes were connected to the power supply. A soldering iron was placed against the structure at the position of the break, and heat was applied to re-melt the solder. Once the solder was re-melted, it reformed the electrical connection within the first conductive region, sealed the break, and the LED could again be re-lit.

EXAMPLE 2

Improving Liquid Metal (Solder) Wetting of PDMS Microfluidic Channels Using an Alkanethiol This example shows the degree to which a liquid metal (e.g., low-melting solder) wets different walls of a channel depending on the material in which the channel is made and/or the chemical that is patterned on the walls of the channel. Contact angles (in degrees) of 10 microliter (μL) drops of low-melting solder alloy LMA-117 (Small Parts, Inc.) on dry PDMS and glass were measured after washing the surfaces with 10 mM octadecanethiol in ethanol. Each contact angle was measured twice: once immediately after placing the drop on the surface, and again after re-melting the drop briefly (~70 degrees Celsius, 1 minute) and allowing it to return to room temperature.

TABLE 1

Contact angles (degrees) of low-melting solder alloy LMA-117 on glass and dry PDMS

| Thiol | Glass (clean) | | PDMS | |
|---|---|---|---|---|
| | Fresh | Reheat | Fresh | Reheat |
| none | 145 | 139 | 133 | 123 |
| Hexadecanethiol | 140 | 131 | 119 | 119 |
| 1-mercapto-undecanoic acid | 140 | 135 | 90 | 88 |

EXAMPLE 3

Techniques Used for Fabrication of Conducting Pathways in Microfluidic Structures Making Microfluidic Channels in PDMS and Filling Channels with Solder to Form "Microsolidic Structures"

Microsolidic structures were fabricated according to the procedure illustrated in FIG. 5. In Step A, masters 500 of the lower and upper layers of a network of microfluidic channels were fabricated in SU-8 photoresist (MicroChem, Inc.) 502 on silicon wafers 501 (in bas-relief) using a procedure described previously in U.S. Pat. No. 6,645,432 and in Xia, Y.; Whitesides, G. M. Soft Lithography. *Angew. Chem. Intl. Ed.* 1998, 37, 550-575; and Duffy, D. C.; McDonald, J. C.; Schueller, O. J. A.; Whitesides, G. M. Rapid Prototyping of Microfluidic Systems in Poly(dimethylsiloxane). *Anal. Chem.* 1998, 70, 4974-4984. The wafers were silanized with (tridecafluoro-1,1,2,2-tetrahydrooctyl)-1-trichlorosilane overnight. In Step B, freshly prepared PDMS (Sylgard 184, Dow Corning, Inc) was spin-coated on the masters to a thickness of 200 μm, cured thermally (70° C., 8 hrs) to form a solid layer 504, and peeled away. Inlet and outlet holes 506 were punched in the PDMS layer 504 containing non-enclosed channels 508 using a needle (16.5 Ga).

A second layer of PDMS was spin coated on a silanized silicon wafer (not shown) to a thickness of 100 μm and was cured thermally (70° C., 8 hrs) to form a solid PDMS base 510. The two layers of PDMS (504 and 510) were exposed to a plasma of oxygen for 1 min and were brought into contact with each other to form a permanent seal. To make the devices easy to handle, the unpatterned base layer 510 was left on the silicon wafer (not shown).

In Step C, to increase the ability of the channels to be wet by the solder, the walls of the channels were silanized. A solution of 3-mercaptopropyltrimethoxysilane in acetonitrile (1:1000 concentration) was introduced into the network of microfluidic channels within 15 min of applying the oxygen plasma as described above to completely fill the channels. PDMS recently (<15 min) exposed to a plasma of oxygen is rendered hydrophilic by the formation of hydroxyl groups on the surface. The solution of 3-mercaptopropyltrimethoxysilane reacts with the surface to form a surface presenting thiol groups (See FIG. 6); the thiols modify the surface energy of the PDMS and make it wettable to liquid solder. The device was then stored at 22 degrees Celsius for 1 hr filled with the silane; after 1 hr, all of the solution had evaporated out of the channel. This process coated the inside surface of the now enclosed microfluidic channels 512 with a silane layer 514 that reduced the free energy barrier for injecting liquid solder.

Liquid solder was injected into the microfluidic channels in Step D. The compositions and physical properties of the eight solder alloys tested (AIM Specialty Solders, Inc. In100, In97/Ag3, In80/Pb15/Ag5, In52/Sn48 and Small Parts, Inc. LMA-117, LMA-158, LMA-255, LMA-288) are listed in Table 2. The microfluidic device was placed on a hotplate a droplet ~1 g) of molten solder was placed at each inlet to the microfluidic channels; the hotplate was 20° C. higher than the melting temperature of the solder. The distribution of temperature in the device was observed using an infrared camera (Inframetrics Inc.); the temperature of the PDMS was approximately uniform with a maximal deviation of 15% below the temperature of the hotplate. A source of negative pressure (120 Ton) was applied to the outlets of the microfluidic channels; the solder was pulled through the microfluidic channels rapidly (<1 s).

other methods. Both the unpatterned and patterned wires embedded in PDMS were held in a coiled shape using alligator clips—when the clips were released, the tension in the PDMS caused the wires to unwind back to their original shape. It was observed that wires with a large cross-sectional area (20000 µm$^2$) maintained a manipulated shape for a longer period of time than wires with small cross-sectional area (100900 µm$^2$).

Figure 7A:
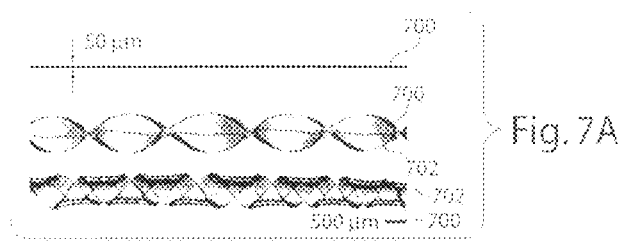
FIGS. 7A-7F are photocopies of photographic images of a variety of flexible metallic wires imbedded in PDMS microfluidic structures, according to certain embodiments of the invention.
Figure 7B:
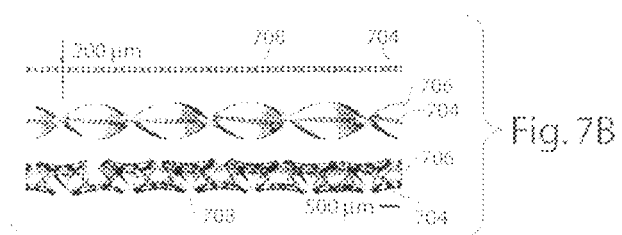
Figures 7C, 7D:
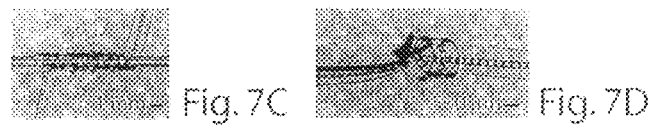
Figure 7E:
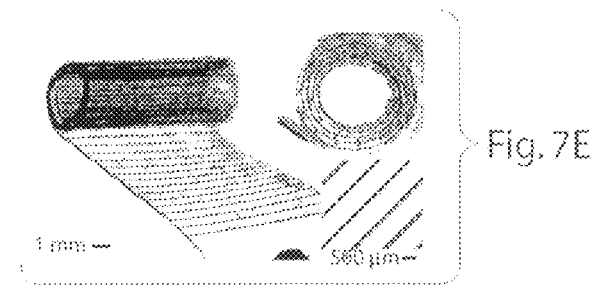
Figure 7F:
Figure 8A:
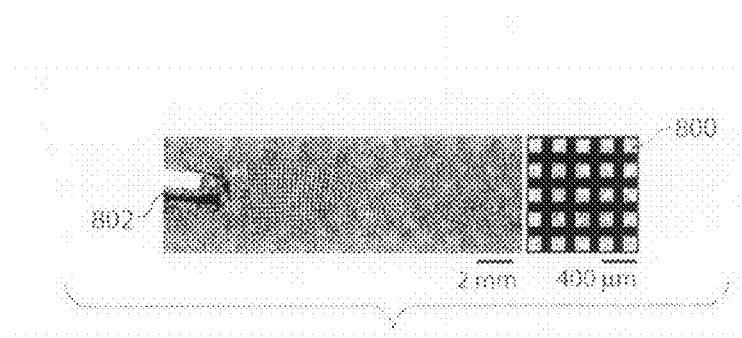
FIGS. 8A-8D are photocopies of photographic images showing flexible metallic gratings imbedded in PDMS produced according to certain embodiments of the invention.
Figure 8B:
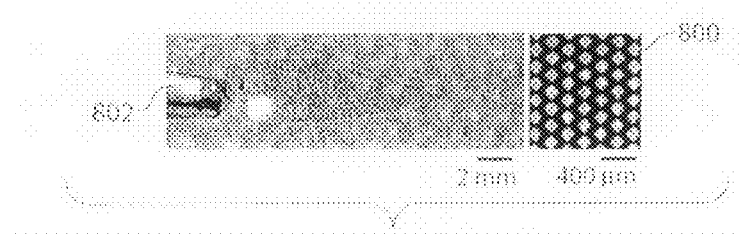
Figure 8C:
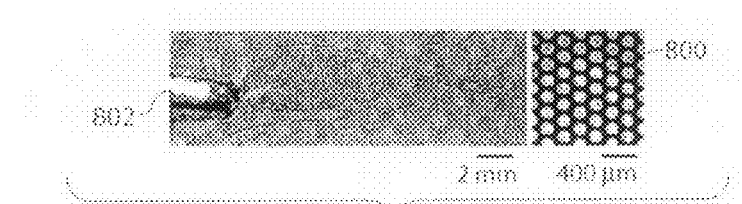
Figure 8D:
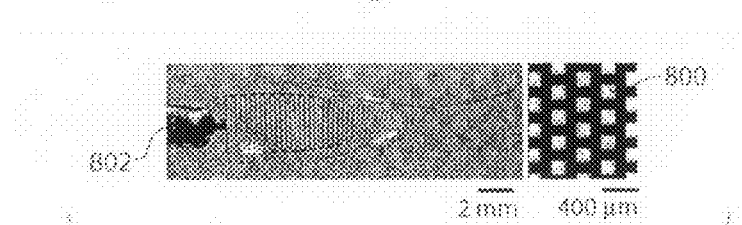

Wires fabricated using the present techniques can be flexed manually into a variety of shapes, for example: they can be wrapped around a capillary tube (FIG. 7C), tied into a knot (FIG. 7D), rolled into "jellyroll structures" (FIG. 7E), and used to fabricate complex woven structures (FIG. 7F). To form the woven structure of FIG. 7F, the ends of three patterned wires were braided into a three-dimensional, woven structure.

TABLE 2

Properties of solder alloys used in the formation of wires and structures. Values for In100 values for In97/Ag3, In52/Sn48, and In80/Pb15/Ag5 were obtained from the supplier, AIM Specialty Inc. and from Hwang, J. S., Modern Solder Technology for Competitive Electronics Manufacturing. McGraw Hill: Boston, 1996. Values for LMA solders were obtained from the supplier, Small Parts, Inc.

| Solder | Melting Point (° C.) | Electrical Conductivity ($\Omega \cdot m)^{-1}$ | Brinnell Hardness (MPa) | Retail Price (US$/g) | Composition (% of total weight) | | | | | |
|---|---|---|---|---|---|---|---|---|---|---|
| | | | | | In | Ag | Bi | Pb | Sn | Cd |
| In100 | 158 | $12 \times 10^6$ | 8.83 | 1.50 | 100 | 0.0 | 0.0 | 0.0 | 0.0 | 0.0 |
| In97/Ag3 | 146 | n.p. | n.p. | 1.50 | 97.0 | 3.0 | 0.0 | 0.0 | 0.0 | 0.0 |
| In80/Pb15/Ag5 | 146 | $\sim 5 \times 10^6$ | ~15 | 1.50 | 80.0 | 5.0 | 0.0 | 15.0 | 0.0 | 0.0 |
| In52/Sn48 | 118 | $6.8 \times 10^6$ | 11.1 | 1.50 | 52.0 | 0.0 | 0.0 | 0.0 | 48.0 | 0.0 |
| LMA-117 | 47 | $2.3 \times 10^6$ | 12.0 | 0.49 | 19.1 | 0.0 | 44.7 | 22.6 | 8.3 | 5.3 |
| LMA-158 | 70 | $2.3 \times 10^6$ | 9.2 | 0.04 | 0.0 | 0.0 | 50.0 | 26.7 | 13.3 | 10.0 |
| LMA-255 | 124 | $2.3 \times 10^6$ | 10.2 | 0.05 | 0.0 | 0.0 | 55.5 | 44.4 | 0.0 | 0.0 |
| LMA-288 | 138 | $2.8 \times 10^6$ | 22 | 0.07 | 0.0 | 0.0 | 58.0 | 0.0 | 42.0 | 0.0 |

After filling the channels with solder, the device 516 was removed from the hotplate and cooled to 25° C.; the solder cooled inside the microfluidic channels/chambers and solidified into solid metal structures in <5 min. The polymeric device was peeled away from the silicon base (Step E) to produce flexible, metallic structures having a minimum cross-sectional thickness of about 50 µm embedded in PDMS (~300 µm thick). FIG. 7A shows a photograph of an exemplary completed device.

EXAMPLE 4

Fabrication of Flexible Wire Structures in Microfluidic Structures

The procedure described above in Example 3 was used to fabricate flexible metal wires embedded in PDMS. FIG. 7A shows a wire 700 (length=5 cm, width=50 µm, height=80 µm) embedded in a layer of PDMS 702 that was unmodified (top), coiled (8 turns—middle), and super-coiled (16 turns—bottom). FIG. 7B shows a similar wire 704 (length=5 cm, width=200 µm, height=80 µm) embedded in PDMS 706 in which the channel contained small PDMS posts 708 (50 µm diameter). This latter example demonstrates that this technique can be used to make wires or other structures with complex patterned features that are not easily fabricated using

EXAMPLE 5

Fabrication of Flexible Gratings in Microfluidic Structures

The inventive "microsolidics" techniques can also be used to fabricate complex, flexible metallic gratings (FIGS. 8A-8D). The fabrication procedure described above in Example 3 was used to pattern solder (length=2 cm, width=5 mm, height=80 µm) in a PDMS microfluidic channel containing posts of PDMS 800 (50-100 µm diameter) that had an essentially circular (FIG. 8C), square (FIGS. 8A (aligned) and 8D (offset)), or diamond (FIG. 8B) cross-section. Applying a vacuum to the outlet of microfluidic channels filled the channels quickly with solder (<1 s) and produced the metallic gratings and meshes with unique patterns. After cooling, the solder-filled PDMS structures were twisted axially one-half turn. The gratings held shape for >1 hr before the shape relaxed slowly. It was also possible to bend the gratings into other shapes (images not shown). The images at the right show a magnified view of the pattern using an optical microscope illuminating the grating from behind; the metal layer appear black. In each case, the metallic structures were 5 mm wide, 2 cm long, and 100 µm thick; the PDMS was 300 µm thick. The grating were twisted axially one-half turn with a pair of tweezers 802. In the right images, the objects are held in place by metal tweezers.

EXAMPLE 6

Figure 9:
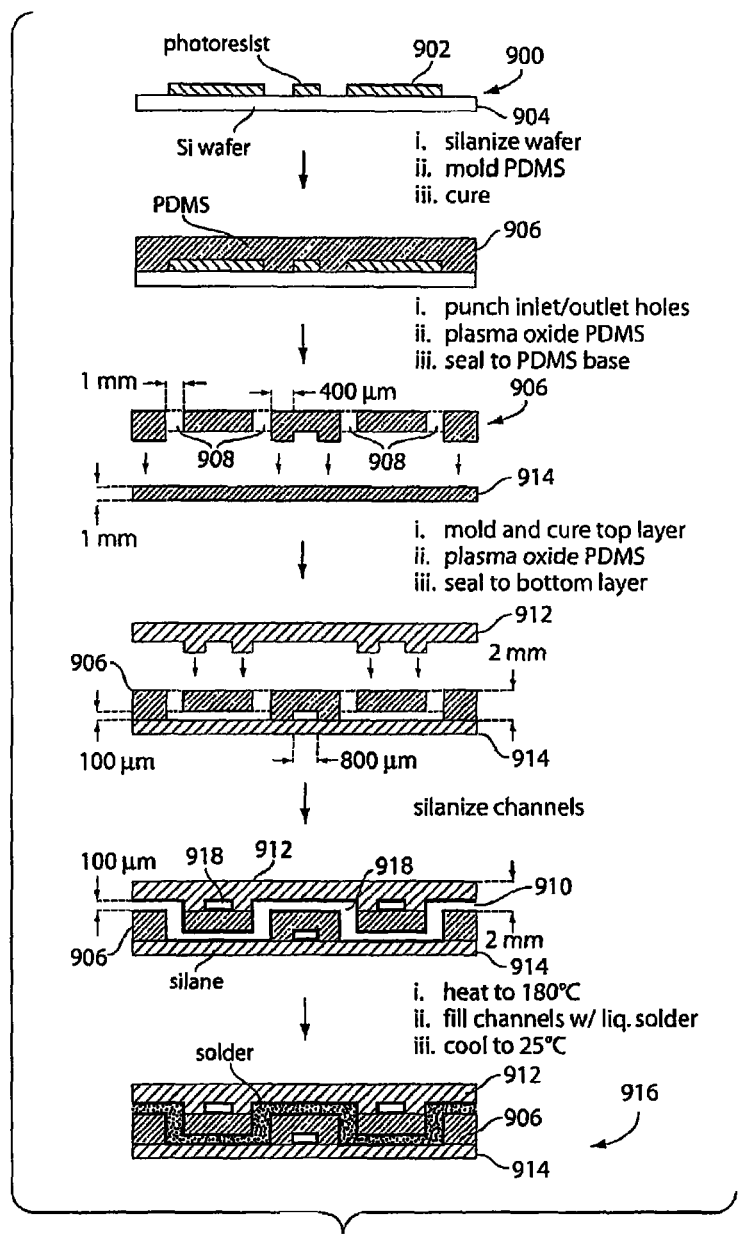
FIG. 9 shows schematic cross-sectional illustration indicating steps of a microfluidic and microsolidic fabrication method involving a multi level basket weave pattern of microfluidic channels.

Fabrication of Microsolidics Structures in Multilevel "3-D" Microfluidic Structures Multilevel microsolidic structures were fabricated according to the procedure illustrated in FIG. 9 (see also U.S. Pat. No. 6,645,432 and Anderson, J. R.; Chiu, D. T.; Jackman, R. J.; Chemiayskaya, O.; McDonald, J. C.; Wu, H.; Whitesides, S. H.; Whitesides, G. M. Fabrication of Topologically Complex Three-Dimensional Microfluidic Systems in PDMS by Rapid Prototyping. *Anal. Chem.*, 2000, 72, 3158-3164). Masters 900 for the upper and lower layers of a network of microfluidic channels were fabricated in photoresist 902 on silicon wafers 904 and silanized as described previously in Example 3. PDMS (Sylgard 184, Dow Corning, Inc) was poured on the masters, cured thermally to form a solid PDMS layer 906, and peeled away. Vias 908 and inlet holes 910 were punched in the lower 906 and upper 912 layers of PDMS, respectively, using needles (22 Ga and 16.5 Ga, respectively). The top layer 912 of PDMS was aligned to the lower layer 906 using a XYZ stage and the two layers of PDMS were exposed to a plasma of oxygen for 1 min. The two layers were bonded together to form a permanent seal. The two-layer/two level device was treated with a second plasma of oxygen and sealed to third, unpatterned layer 914 of PDMS that served as a substrate. Within 15 min of applying the plasma of oxygen, a solution of 3-mercaptopropyltrimethoxysilane in acetonitrile (0.1 M) was flowed into the network of microfluidic channels and the device was stored at 22 degrees Celsius for 1 hr, as described above in Example 3. The microfluidic channels were filled with liquid solder and cooled to form a solid metal structure 916 embedded in PDMS as described above in Example 3. The serpentine enclosed flow path 918 represents a single "weave" in the pattern. The overall microfluidic structure has the structure illustrated previously in FIG. 4. FIG. 6A shows a photograph of a completed device.

Figure 10A:
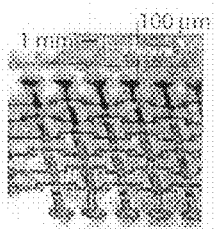
FIGS. 10A-10E are photocopies of photographic images illustrating a variety of metallic microstructures fabricated according to certain embodiments of the invention.

As apparent from this example, the inventive "Microsolidics" techniques makes it possible to fabricate multilevel devices in three dimensions by multilayer lithography (FIG. 9). The devices of FIGS. 10A-10E were fabricated using the techniques of the present example. FIG. 10A shows a magnified image of a solder microstructure in the basket weave pattern of FIG. 4.

Figure 10D:
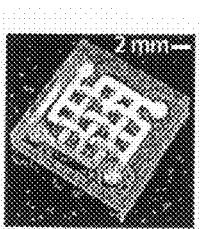
Figure 10B:
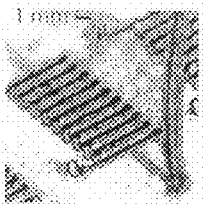

FIG. 10B shows a solder coil fabricated around a central microfluidic channel having a structure substantially similar to that shown previously in FIG. 5. The coil was constructed by aligning and bonding four layers of PDMS—three of the layers contained microfluidic channels. After sealing, solder was injected into the coil in one step.

Figure 10E:
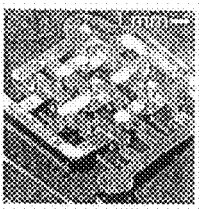
Figure 10C:
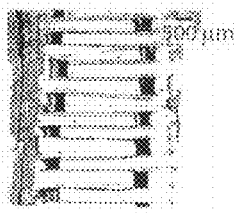

FIG. 10C illustrates the use of microsolidic fabrication to produce structures that traverse many layers in three dimensions. The image shows a device composed of 16 layers of PDMS; each layer contains features—two parallel microfluidic channels—that were fabricated via the techniques described in the present example. After aligning and bonding the layers together, as previously described, solder was injected through all 16 layers of PDMS in one step and the metal was cooled and solidified to form a solid, continuous solder wire.

EXAMPLE 7

Mechanical Release of Solder Structure from Microfluidic Structures to Produce Freestanding Metal Structures To release freestanding structures from microfluidic channels, layer of PDMS with non-enclosed microfluidic channels therein was treated with a plasma of oxygen and pressed into conformal contact with a glass slide that had not been oxidized to adhere it to the glass and form enclosed channels in a manner to that described previously in Example 3, except that the glass slide replaced the unfeatured bottom PDMS layer. The channels were silanized, filled with solder, and cooled as previously described. Metallic structures were released from the microfluidic network by peeling away the PDMS layer from glass slide. The solid, metallic structures remained on the glass slide and were removed from the slide by cutting at the interface of the solder and the glass with a razor blade.

EXAMPLE 8

Chemical Release of Solder Structure from Microfluidic Structures to Produce Freestanding Metal Structures Microsolidic metal structures were released from PDMS in this example by dissolving the polymer in a 1.0 M solution of tetrabutyl ammonium fluoride (TBAF) in N,N-dimethylformamide (DMF) at 25 degrees Celsius for 48 hrs without agitation. This process was particularly useful for freeing metallic structures from multilevel microfluidic networks that could not be released by peeling away the PDMS. After release, the metallic structures were removed from the solution with tweezers and mounted it on a glass slide with epoxy to image them using light microscopy. FIG. 10D shows the metallic structure having a basket weave pattern (see Example 6 and FIG. 10 A) embedded in PDMS. FIG. 10E shows the same structure after it was released from the polymer using the above described chemical release process.

EXAMPLE 9

Coating Freestanding Microstructures with Other Metals

After release of the microstructures as described in Example 8, the solder microstructures were coated with layers of other metals by electroplating or electroless deposition. Copper was electrolessly plated on the released microsolidic structure with Electroless Copper EC 50 solutions A and B (Technic, Inc., Cranston, R.I.) according to the instructions given by the manufacturer. After coating the solder with copper (about 1 hour immersion, gentle agitation by an orbital shaker), other metals were electroplated, including 1 micron gold (Technic Gold 25; Technic, Inc.; Cranston, R.I.) and 2 microns nickel (Nickel Plating Solution SN10 Type; Transene; Danvers, Mass.).

EXAMPLE 10

"Healing" Solder Microstructures

Figure 11A:
FIGS. 11A-11D are photocopies of photographic images illustrating a process of healing solder microstructures according to certain embodiments of the invention.
Figure 11B:
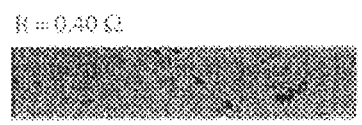
Figure 11C:
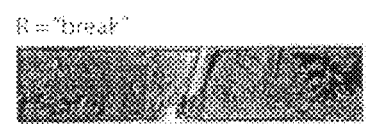
Figure 11D:
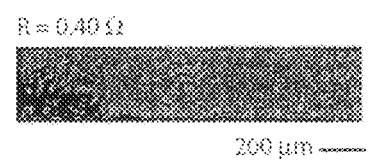

Breaks or defects in solder microstructures can be repaired or "healed" (see FIGS. 11A-11D). A metallic wire 1100 of solder alloy (In100) (height=80 μm, width=500 μm, length=5 mm) was fabricated between two layers of PDMS as described above in Example 3 (FIG. 11A—the "break region 1102 is shown magnified in FIGS. 11B-11D). The electrical resistance of the wire 0.40Ω when unbroken (FIG. 11B). The PDMS structure was bent 180° to break the embedded wire. The resistance of the bent wire was infinite (FIG. 11C). The device was then heated to 100° C. for 5 min and then placed in a sonication bath for 1 sec. Following this procedure, the resistance of the solder wire was again 0.40Ω (FIG. 11D). As alternatives to using a sonication bath to facilitate "healing," a sonication probe may be employed, a high voltage may be applied across the terminals of the wire, or the PDMS structure may be squeezed in the vicinity of the molten wire.

PROPHETIC EXAMPLE 11

Fabrication of a Flexible Microsolidic FM Radio

The inventive microsolidics techniques makes it possible to fabricate flexible networks of wires for interfacing with and interconnecting electronic components to form functional electrical circuits and devices. To demonstrate this capability, an FM radio is fabricated that is embedded in PDMS. The FM radio comprises an 8-pin DIP processor, resistors, capacitors, an external 9 V battery, and external headphones. The connecting wires in the device comprise the metal solder injected into microfluidic channels according to the procedures described previously. The radio can be bent and twisted and successfully receives and amplifies FM radio stations from 87.9 FM to 107.9 FM.

EXAMPLE 12

Fabrication of a "Microsolidic" Radiofrequency Transformer

Figure 12A:
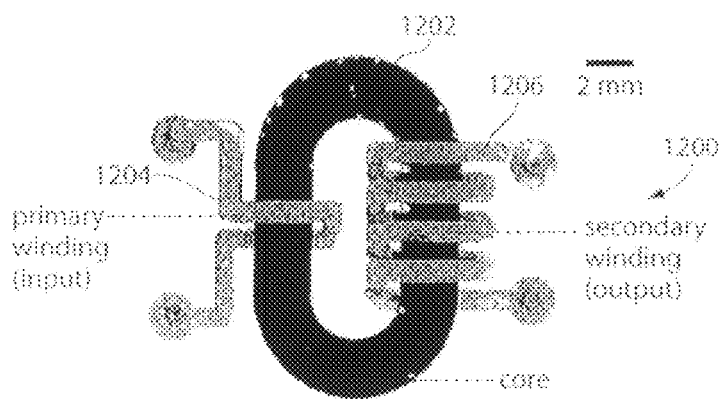
FIG. 12A is a photocopy of photograph showing a magnified image of a high frequency microtransformer embedded in PDMS produced according to the invention.

The inventive methods makes it possible to fabricate complex electronic devices and circuits in multilevel microfluidic structures. FIG. 12A shows a photograph of a high frequency transformer 1200 embedded in a PDMS structure. The transformer contained an air-filled core 1202 (height=80 width=2.5 mm, length=31 mm) for directing the magnetic field, a helical wire comprising a primary solenoid 1204 and a helical wire comprising a secondary solenoid 1206 (both formed of In100, height=80 μm, width=800 μm), each of which were wound around opposing sides of the central core 1202. The transformer was fabricated using a procedure similar to that outlined in Example 6. Three layers of PDMS comprising microfluidic channels were aligned and bonded together, solder was injected into the channels for the primary and secondary solenoids and cooled to form solid wires, as previously described. For the transformer shown in the image, the ratio of the turns of the primary solenoid to the turns of the secondary solenoid (turns ratio) is 1/4.

Figure 12B:
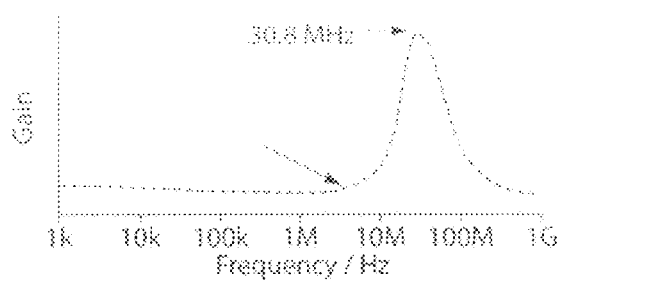
FIG. 12B is a graph illustrating the frequency response of the transformer of FIG. 12A.
Figure 12C:
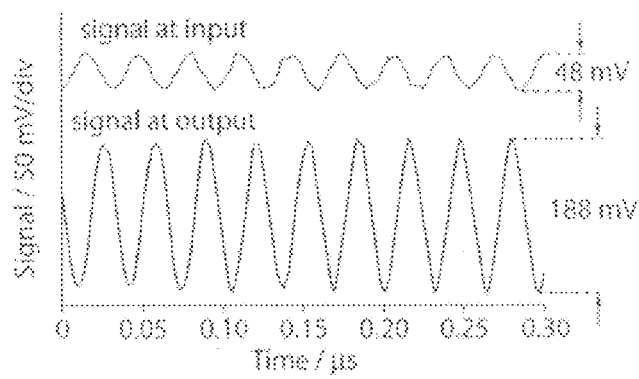
FIG. 12C is a graph showing the characteristic waveforms across the primary solenoid and the secondary solenoid of the microtransformer of FIG. 12A.

To characterize the transformer, a periodic signal was applied—with an amplitude of 48 mV (peak-to-peak) from a high-frequency function generator—across the input (primary solenoid 1204) of the device. To make the electrical connections copper wires (Digikey Inc, 200 μm diameter) were inserted into the inlet holes of the solder channels when the solder was still liquid. The wires were fixed in place when the solder was cooled. Micrograbber™ alligator clips (Pomona Inc) were connected to the copper wires in order to connect the external electrical wires and the network of solder structures embedded in the PDMS. The signals at the input and output (secondary solenoid 1206) of the transformer were measured with a high frequency oscilloscope. The frequency of the waveform applied across the input of the transformer was increased to determine the frequency response of the device (see FIG. 12B). Measuring at the output, a peak resonant frequency was observed at 30.8 MHz. FIG. 12 C shows characteristic waveforms across the input (primary solenoid 1204) and output (secondary solenoid 1206) of the transformer at the resonant frequency (30.8 MHz) measured with the oscilloscope. The amplitude of the input signal was 48 mV peak-to-peak (5 mV error). The amplitude of the output signal was 188 mV peak-to-peak (5 mV error), yielding a voltage conversion factor of 3.92 and an efficiency of 98%.

EXAMPLE 13

Fabrication of a Coil Microheater

Figure 13A:
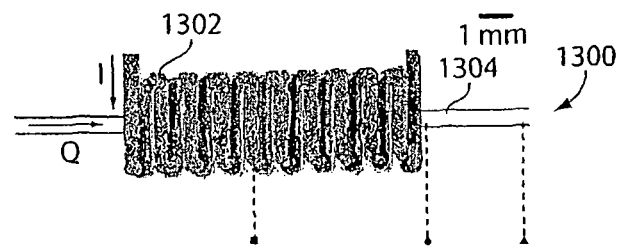
FIG. 13A is a photocopy of photograph showing a coil microheater embedded is PDMS, fabricated according to certain embodiments of the invention.

The present invention provides useful techniques for fabricating hybrid electronic-microfluidic systems. An example of such a device is shown in FIG. 13A. FIG. 13A shows a coil microheater 1300 embedded in PDMS. The device contained a solder coil 1302 (In100, height=80 μm, width=800 μm, length=12 cm) positioned axiosymmetrically around a central microfluidic channel 1304 (height=80 μm, width=800 μm, length=3 cm) (the exterior walls of the central microfluidic channel were darkened in FIG. 13A for clarity). The overall configuration of the structure was similar to that illustrated previously in FIGS. 4B and 10B. The coil 1302 is wrapped (ten times) around a section of the microfluidic channel 1304 that is 1.6 cm in length. The device was fabricated using a procedure similar to that outlined in Example 6. Three layers of PDMS comprising microfluidic channels were aligned and bonded together. Solder was injected into the channels for coil and cooled to form a solid conductive pathway, as previously described.

Figure 13B:
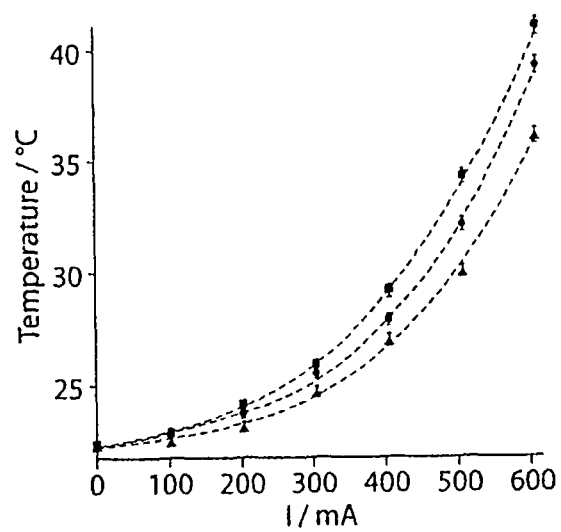
FIG. 13B is a plot showing the temperature in the microfluidic channel of the coil microheater of FIG. 13A as a function of electrical current through the coil of the microheater.

To characterize the microheater, a series of electrical currents (I=0-600 mA, at 100 mA intervals) were applied through the coil while flowing deionized water through the central channel (flow rate Q=100 μL/min). To make the electrical connections copper wires (Digikey Inc, 200 μm diameter) were inserted into the inlet holes of the solder channels when the solder was still liquid. The wires were fixed in place when the solder was cooled. Micrograbber™ alligator clips (Pomona Inc) were connected to the copper wires in order to connect the external electrical wires and the network of solder structures embedded in the PDMS. The temperature of the fluid passing through the microfluidic channel increased proportional to the intensity of electric current passed through the solder coil due to Joule heating (FIG. 13B). Electrical current was applied to the coil and fluid was flowed through the microfluidic channel continuously for 5 min (to equilibrate) prior to measuring the temperature of the water. The temperature of the water in the microfluidic channel at steady state was recorded using an infrared camera (Inframetrics, Inc.).

EXAMPLE 14

Fabrication of a Hybrid Microfluidic Electromagnet Device and Use of the Device to Capture and Release Superparamagnetic Beads Flowing in a Microfluidic Channel In this example, electromagnets were fabricated in a PDMS structure containing microfluidic channels, which structure was bonded to glass slides using a procedure similar to that described above in Examples 3 and 7 and briefly below. The procedure is also outlined in FIG. 14A. In these devices, referring to FIG. 14B, two outer channels 1404 and 1406 were filled with solder as described previously to form the electromagnets 1408 and 1410. The central channel 1402 was used for fluids. We used an electronic circuit to control the electrical current applied to the two electromagnets (see below and FIG. 15).

Modeling Magnetic Fields Generated by Electromagnets

Figure 16A:
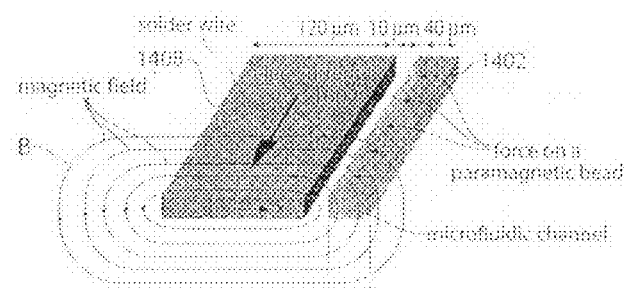
FIG. 16A is a schematic illustration of a portion of the electromagnet of FIG. 14B illustrating the magnetic field generated and the forces on a paramagnetic bead present in the microchannel.

Without being limited to any particular theory of operation of the inventive microfluidic electromagnet systems, the following discussion is provided to guide those skilled in the art as to certain parameters and details of construction and operation to consider when forming electromagnet systems according to the invention. Referring to FIG. 16A, when an electrical current passes through a wire, it generates a magnetic field B. Equation 1 describes the intensity of the magnetic field as a function of the distance from the axial center of a cylindrical wire of unlimited length. Here, $I_{wire}$ is the current through the wire (Amp (A)), x is the distance from the center of the wire (m), and $\mu_0$ is the permeability of free space ($1.26 \times 10^{-6}$ H/m):

$$|B| = \mu_0 \frac{I_{wire}}{2\pi x} \tag{1}$$

Figure 16B:
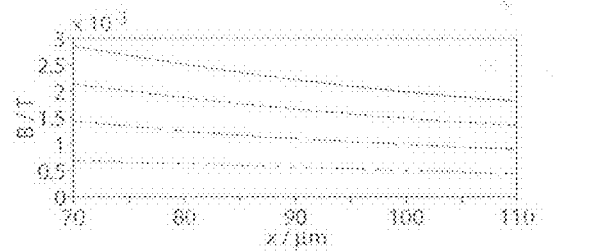
FIG. 16B is a graph showing the magnetic field generated by the electromagnet of FIG. 14B as a function of distance from the electromagnet within the microfluidic channel.

Current passing through a wire generates a magnetic field with intensity proportional to 1/x in a direction orthogonal to the direction of the flow of current. FIG. 16B contains a graph demonstrating the magnitude of the magnetic field produced by passing a constant current through a wire as a function of distance x in the microfluidic channel.

A magnetic field gradient produces a force on a paramagnetic bead in the direction of the increase in the magnitude of the field. Equation 2 is a formula for calculating this force as function of four parameters: the gradient of the magnetic field squared, $\nabla B^2$ ($T^2/m$), the volume of the bead, V ($m^3$), the susceptibility of the bead, $\chi$ (dimensionless), and the permeability of free space, $\mu_0$ (Lee, H.; Purdon, A. M.; Westervelt, R. M. Manipulation of biological cells using a microelectromagnet matrix. *App. Phys. Lett.* 2004, 85, 1063-1065):

$$F = \frac{V\chi}{\mu_0} \nabla B^2 \tag{2}$$

Figure 16C:
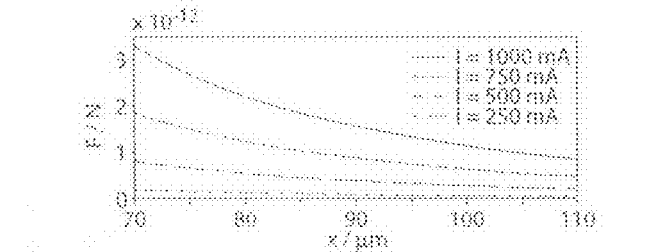
FIG. 16C is a graph corresponding to the graph of FIG. 16B showing the force generated on a paramagnetic bead present in the microfluidic channel.

Combining equations 1 and 2 produces an equation (Eq. 3) for the force exerted on a superparamagnetic bead in the x-direction by passing a DC current through a wire. FIG. 16C contains a graph describing this force as a function of x.

$$F_x = -V\chi\mu_0 \frac{I_{wire}^2}{2\pi^2 x^3} \tag{3}$$

FIG. 16A shows a graphical model a portion of the electromagnet with corresponding plots of the magnetic field (FIG. 16B) and force (FIG. 16C) exerted on a superparamagnetic bead by an electrical current applied through an electromagnet 1408 positioned 10 μm from a microfluidic channel 1402. The magnetic field B is described by field lines orthogonal to the orientation of the solder wire of the electromagnet; horizontal lines in the microfluidic channel describe the force field; x describes the distance from the center of the wire. A solder wire of infinite length and uniform current density is assumed in the modeling. Also assumed for the purpose of FIG. 16 C is that the beads are perfectly spherical beads with susceptibility 0.165 and diameter 5.9 μm. For currents of 250 mA, 500 mA, 700 mA, and 1000 mA, peak magnetic field intensities (and peak forces) were determined to be 0.714 mT (0.206 pN), 1.43 mT (0.823 pN), 2.14 mT (1.85 pN), and 2.86 mT (3.29 pN), respectively.

Two forces act on a superparamagnetic particle in the microchannel—the magnetic force, $F_x$, (Equation 3) and the Stokes force, $F_s$, due to the viscous drag exerted by the suspending liquid (Equation 4). In equation 4, η is the dynamic viscosity of the suspending medium ($10^{-3}$ kg/m·s), v is velocity of the superparamagnetic particle (m/s), and R is radius of the particle (m):

$$F_s = -6\pi\eta v R \tag{4}$$

By combining equations 3 and 4, an equation was derived (see section below for details of derivation) for the time T to move a superparamagnetic particle from one sidewall of the microchannel to the opposite wall (Equation 5). Here, a is distance from the center of the electromagnet to the sidewall of the microfluidic channel (m) and b is the distance from the center of the electromagnet to the initial position of the superparamagnetic particle (m); we assume a uniform initial distribution of particles across the channel and neglect the inertia of the particle. The results of the model are shown as the dashed line in FIG. 18D (shown fitting the observed time capture date—obtained as discussed in more detail below—well).

$$T = \frac{9}{4} \frac{\pi^2 \eta}{\chi \mu_0 R^2} \cdot \frac{(b^4 - a^4)}{I_{wire}^2} \tag{5}$$

Derivation of the Time to Move a Superparamagnetic Bead Across a Microfluidic Channel The balance of forces (in the x-direction) acting on a superparamagnetic particle in the microchannel is:

$$ma = F_s + F_x \tag{6}$$

Neglecting the inertia of the bead (ma=0) and substituting the corresponding equations for the magnetic force $F_x$ (Equation 3) and the Stokes force $F_s$ (Equation 4) produces the following expression:

$$0 = 6\pi\eta v R - V\chi\mu_0 \frac{I_{wire}^2}{2\pi^2 x^3} \tag{7}$$

For a superparamagnetic bead moving in the negative x-direction (towards the electromagnet), Equation 7 simplifies to the following equation:

$$V\chi\mu_0 \frac{I_{wire}^2}{2\pi^2 x^3} = 6\pi\eta R\left(-\frac{dx}{dt}\right) \tag{8}$$

Separating the independent variables in Equation 8 and expressing the volume of particle in terms of its radius produces the following expression:

$$\frac{1}{9}\frac{\chi\mu_0}{\pi^2\eta} R^2 I_{wire}^2 \cdot dt = -x^3 \cdot dx \tag{9}$$

Integrating Equation 9 from the initial position of the superparamagnetic particle, b, to the position of the sidewall of the microfluidic channel, a, produces the following expression:

$$\frac{1}{9}\frac{\chi\mu_0}{\pi^2\eta}R^2 I_{wire}^2 \cdot \int_0^T dt = -\int_b^a x^3 dx \quad (10)$$

Solving Equation 10 for T produces Equation 5 for the time required to move a bead across a microfluidic channel:

$$T = \frac{9}{4}\frac{\pi^2\eta}{\chi\mu_0 R^2} \cdot \frac{(b^4 - a^4)}{I_{wire}^2} \quad (5)$$

Temperature Characteristics of Electromagnets

Electrical current passing through a metallic wire produces Joule heating, causing the temperature of the wire to increase. The increase in the temperature of the wire can be calculated from Equation 11:

$$T_{max} - T_{ref} = \frac{xI^2}{\sigma k t w^2} \quad (11)$$

Here, $T_{max}$ is the maximum temperature of the wire (° K), $T_{ref}$ is the temperature of the glass substrate (° K), x is the thickness of the substrate (m); σ is the conductivity of the wire (m/Ω), k is the thermal conductivity of the substrate (W/m·° K), t is the thickness of the wire (m), and w is the width of the wire (m).

A model was derived based upon Equations 3 and 11 to determine the width of a wire that would generate the maximum force upon a superparamagnetic bead without exceeding a maximal steady state temperature. Using an average bead diameter of 5.9 µm, χ=0.165, r=30 µm, x=700 µm, σ=1.20*10$^7$ mhos/m, k=1.12 W/(m·° K), t=40 µm, a substrate temperature $T_{ref}$=22° C., and a maximum steady state temperature $T_{max}$=50° C., it was determined that a maximum force of 1.71 pN was obtained for a wire approximately 120 µm wide (FIG. 17A-17C). All of the electromagnets in this example were constructed using wires with this optimal width.

FIGS. 17A-17C illustrate model calculations for the maximum current (FIG. 17A), magnetic field (FIG. 17B), and force (FIG. 17C) upon a magnetic bead calculated from Equations (1), (3), and (12) as a function of electromagnet width. The following parameters were assumed: bead diameter=5.9 µm, χ=0.165, r=30 µm, x=700 µm, σ=1.20*10$^7$ mhos/m, k=1.12 W/(° K m), t=100 µm, a substrate temperature $T_{ref}$=22° C., and a maximum steady state temperature $T_{max}$=50° C. Using these parameters, a maximum force of 1.71 pN was determined for a wire width of approximately 120 µm.

Fabrication of Microfluidic Channels

Figure 14A:
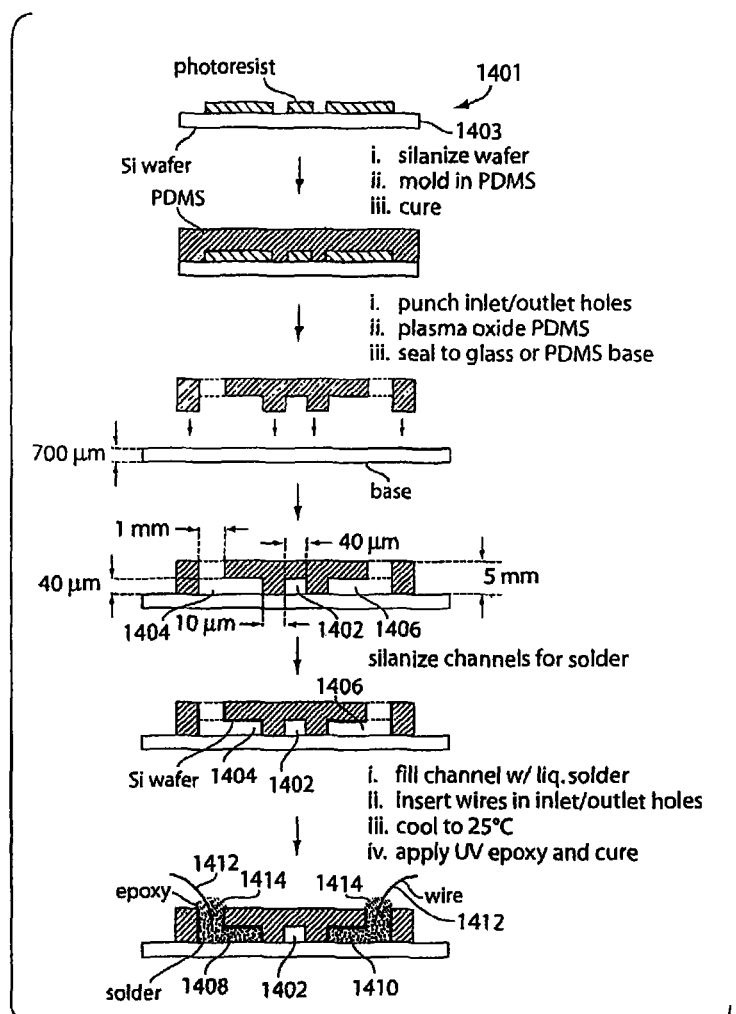
FIG. 14A is a schematic, cross-sectional diagram depicting the fabrication of an electromagnet in PDMS, according to certain embodiments of the invention.
Figure 14B:
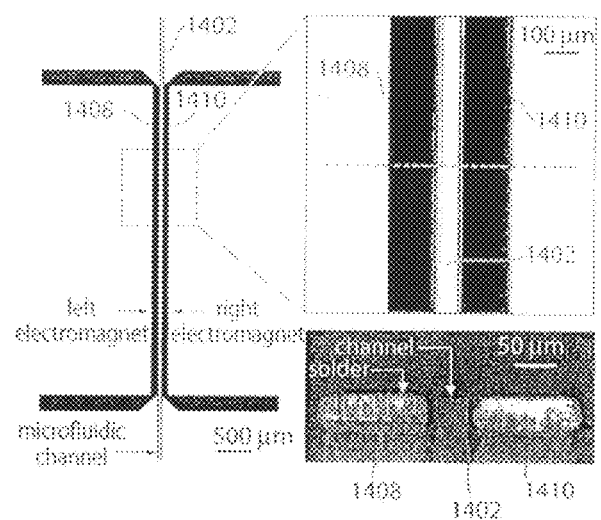
FIG. 14B is a photocopy of a photographic image of a cross-section of the electromagnet device fabricated according to the steps illustrated in FIG. 14A.

Microfluidic structures were fabricated according to the procedure illustrated in FIG. 14A. The master 1401 of the microfluidic channels was fabricated in SU-8 photoresist (MicroChem, Inc) on a silicon wafer 1403 as described above in Example 3. The master was silanized with (tridecafluoro-1,1,2,2-tetrahydrooctyl)-1-trichlorosilane overnight. PDMS (Sylgard 184, Dow Corning, Inc) was poured on the master, cured thermally, and peeled away. Inlet and outlet holes were punched into the layer of channels using a needle (22 Ga).

The PDMS and a glass substrate were exposed to a plasma of oxygen for 1 min, and the PDMS and glass were brought into contact to form a permanent seal. Within 15 min of applying the plasma of oxygen, a solution of 3-mercaptopropyltrimethoxysilane in acetonitrile (0.1 M) was flowed into the network of microfluidic channels and the device was stored at 22° C. until the solution had evaporated out of the microfluidic channels (~1 hr). This process coated the inside surface of the microfluidic channels with a silane that reduced the surface free energy and facilitated wetting of the walls of the microfluidic channels with the liquid solder.

Injection of Liquid Solder

A glass syringe (10 mL, MicroMate Inc) wrapped in silicone heating tape (Daigger Inc) heated to ~200° C., was filled with liquid solder alloy (5 g, 99.99% In, AIM Solders Inc). The device with microfluidic channels was placed on a hotplate set to 200° C. Solder was injected into the microfluidic channels of the device by inserting the tip of the syringe into one inlet of the microfluidic channel and applying pressure to the syringe. Liquid solder quickly filled the channels (<1 sec).

Cooling the Solder Forms Electrical Wires

Copper wires 1412 (Digikey Inc, 200 µm diameter) were inserted into the inlet and outlet holes of the solder channels when the solder was still liquid (FIG. 14A, bottom). The device was then removed from the hotplate and cooled it to 25° C. on a glass plate. The solder solidified into the shape of the system of microfluidic channels. This process also fixed the copper wires into place at the inlets and outlets of the channels. To reinforce the electrical wires, a photocurable polyurethane 1414 was applied and cured (NOA81, Norland Products, Inc) at the point of contact of the electrical wires and the solder (FIG. 14A bottom). Nanograbber™ alligator clips (Pomona Inc) were attached to the copper wires in order to connect the external electrical wires and the network of solder structures embedded in the PDMS.

Electronics Setup

Figure 15:
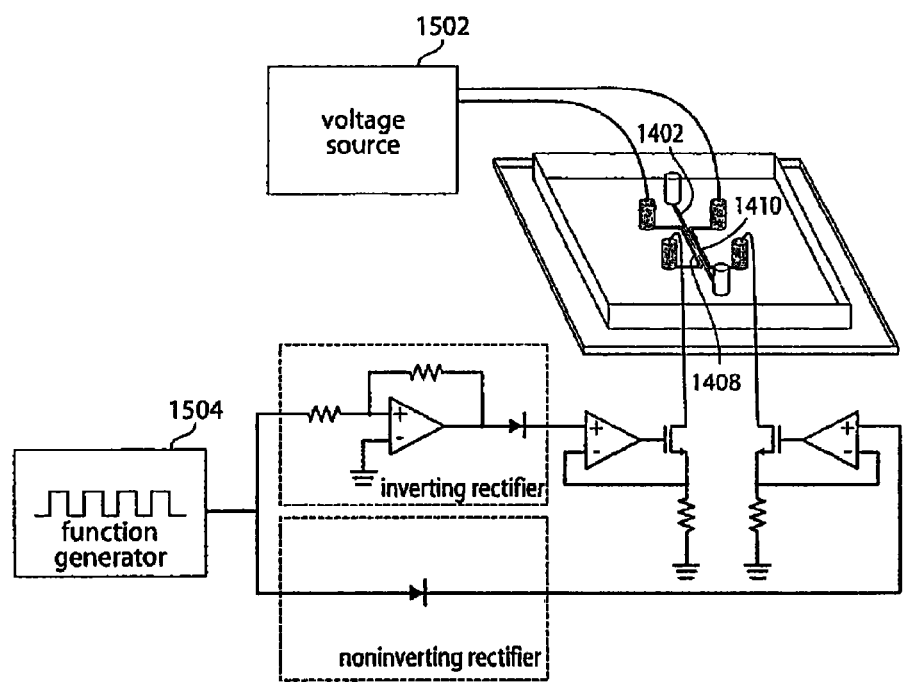
FIG. 15 is a schematic diagram of an electronic circuit used to drive the pair of electromagnets of the electromagnet of FIG. 14B.

FIG. 15 shows a schematic diagram of the electronic circuit used to drive the electromagnets. A 10 V power supply (BK Precision, Inc), and a dual 6V, 10V power supply (Agilent, Inc) (collectively 1502), were connected to the circuit. A signal of variable amplitude and frequency was applied to the circuit using a function generator 1504 (Agilent, Inc). An increase in the amplitude of the signal increased the current through the electromagnets and increased the intensity of the magnetic field.

Sorting Superparamagnetic Beads Flowing in a Microfluidic Channel

The microsolidic electromagnet device described above was used to build a switch to sort a stream of superparamagnetic beads flowing in microfluidic channel 1402 into one of two downstream microfluidic channels 1802, 1804 (FIG. 18E-18F). Briefly, as described in more detail below, when both electromagnets were off, a suspension of superparamagnetic beads flowed into both the left and right microfluidic channels at the junction (FIG. 18E). When the left electromagnet was activated (the right electromagnet was off), the beads were pulled to the left surface of the channel, and were subsequently directed into the left microfluidic channel (FIG. 18F). When the right electromagnet was activated (the left electromagnet was off), the beads were pulled to the right surface of the channel and were subsequently directed into the right microfluidic channel (FIG. 18G).

Using a programmable signal from function generator 1504 to turn on/off electromagnets 1408, 1410 present on either side of the central microfluidic channel 1402, superparamagnetic beads (5.9 µm diameter, χ=0.165) were captured and released from either side of the microfluidic channel at a frequency of 0.5 Hz for over 100 cycles (FIGS. 18A-18C)—the beads were suspended in buffer (2% Bovine Serum Albumin, 0.05% Tween 20, 0.1% NaN$_3$ by volume) at a concentration of approximately 5×10$^8$ beads/mL before adding them to the channel. The suspension of beads was injected into the microfluidic channel using a syringe; the beads were motionless and dispersed uniformly throughout the channel prior to the start of the experiment.

Figure 18D:
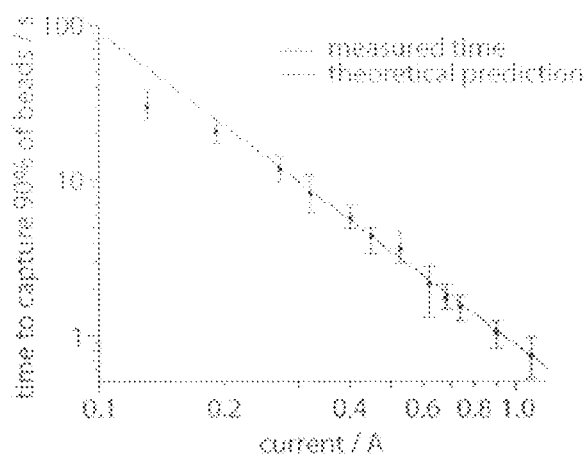
FIG. 18D is a graph showing the response time required for capturing beads following activation of the electromagnet of FIG. 14B.
Figures 18E, 18F, 18G:
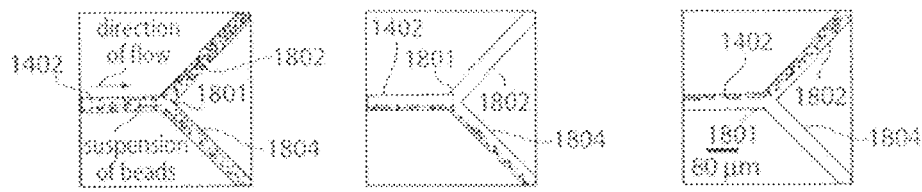
FIGS. 18E-18G are photocopies of photographic images illustrating the sorting of paramagnetic beads in the microfluidic channels of the electromagnetic device of FIG. 14B.

The time required to capture a population of superparamagnetic beads in buffer in a microfluidic channel is plotted in FIG. 18D. To obtain the data a suspension of superparamagnetic beads was injected into channel 1402, the flow was stopped, and a section of the channel that contained 20 beads was imaged. A current was passed through an adjacent electromagnet, the time to "capture" 90% of the beads—that is, to move beads from inside the microfluidic channel into contact with the wall was recorded. The "time of capture" was measured at various currents applied to the wire between 80 mA and 1080 mA.

FIG. 18 A-18C are photocopies of images showing the capture and release of superparamagnetic beads 1806 (5.9 μm in diameter) in microfluidic channel 1402 in proximity to two electromagnets 1408, 1410 (in black) located above and below the microfluidic channel in the image. The series of images was taken over a time period of 3 sec. FIG. 18A shows the microfluidic channel with no current applied to the electromagnets. FIG. 18B shows the microfluidic channel after a current (1 A, in the direction of the arrow) was applied for 1 s to the top electromagnet 1408; the current generated a magnetic field oriented into the plane of the page, with greatest magnitude at the top surface of the microfluidic channel. The gradient in the magnetic field exerted a force on the beads. Turning the current on/off made it possible to capture and release beads from the surface of the microfluidic channel. FIG. 18C shows the microfluidic channel after the current in the top electromagnet 1408 was turned off, and a current of 1 A was applied to the bottom electromagnet 1410 for 1 s. The process was repeated over 100 times with similar results. FIG. 18D present data for model results and experimental measurements of the response time of beads following activation of the electromagnet. Data points represent the average time to capture (i.e. place in contact with the wall) 90% of a population of superparamagnetic beads measured over five experiments. The error bars represent the range of the measured values. The time to capture the beads follows an inverse power relationship with the current (Equation 5).

FIGS. 18E-18G illustrate the results of sorting superparamagnetic beads in a liquid flowing in microfluidic channels. A suspension of beads was flowed through a microfluidic channel 1402 at a rate of ~10 μL/hr. Two electromagnets 1408, 1410 were fabricated on either side of the microfluidic channel 1 cm upstream of a junction 1801. The electromagnets were used to divert the beads to flow through the top 1802 or bottom channel 1804 at the junction. FIG. 18E is an image of the junction when both electromagnets were turned off. FIG. 18F shows the junction after the bottom electromagnet 1410 was activated for 1 s (and the top electromagnet 1408 was turned off). FIG. 18G shows the junction after the top electromagnet 1408 was activated for 1 s (and the bottom electromagnet 1410 was turned off). For all experiments, the superparamagnetic beads were suspended in a buffer at a concentration of 5×10$^8$ beads/mL prior to injecting them into the microfluidic channel. The height and width of the channel 1402 was 40 μm. The distance between each electromagnet and the channel was 10 μm.

While several embodiments of the present invention have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present invention. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present invention is/are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described and claimed. The present invention is directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present invention.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of", when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

It should also be understood that, unless clearly indicated to the contrary, in any methods claimed herein that include more than one step or act, the order of the steps or acts of the method is not necessarily limited to the order in which the steps or acts of the method are recited.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

What is claimed is:

1. A method of fabricating an electrically conductive pathway comprising steps of: providing a structure defining a microfluidic system, the microfluidic system comprising a substantially covered microfluidic channel; causing a liquid metal to flow into at least a portion of the substantially covered microfluidic channel to form an electrically conductive pathway, the metal having a temperature greater than a melting point of the metal; cooling the liquid metal within the substantially covered microfluidic channel to a temperature less than the melting point of the metal, thereby causing the metal to become solid and form the electrically conductive pathway within the microfluidic system; passing an electrical current through the electrically conductive pathway; and modifying the shape of at least a portion of the structure and the electrically conductive pathway after the passing step.

2. The method of claim 1, wherein the structure defining a microfluidic system comprises a layer having a length of the layer measured along a first direction, a width of the layer measured along a second direction perpendicular to the first direction, and a thickness of the layer measured along a third direction perpendicular to both the first and the second directions, the thickness of the layer being less than the length of the layer and less than the width of the layer, and wherein the substantially covered microfluidic channel does not traverse the entire thickness of the layer.

3. The method of claim 2, wherein the substantially covered microfluidic channel lies within a plane or curved surface defined by the first and second directions.

4. The method of claim 2, wherein the structure defining the microfluidic system is formed of a flexible material.

5. The method of claim 1, wherein at least a portion of a wall of the microfluidic channel is treated by a process that enables the portion of the wall to be wet by the metal, prior to flowing the metal into the channel.

6. The method of claim 5, wherein the process comprises chemically altering at least a portion of the wall.

7. The method of claim 6, wherein the process comprises exposing the wall to a chemical able to adhere or chemically bind to the wall.

8. The method of claim 7, wherein the chemical comprises an alkanethiol or a silane.

9. The method of claim 8, wherein the chemical comprises 3-mercaptopropyltrimethoxysilane.

10. The method of claim 1, wherein the microfluidic channel has at least one cross-sectional dimension of less than about 1 mm.

11. The method of claim 1, wherein the microfluidic channel has at least one cross-sectional dimension of less than about 100 microns.

12. The method of claim 1, wherein the microfluidic channel has at least one cross-sectional dimension of less than about 10 microns.

13. The method of claim 1, wherein the microfluidic channel has at least one cross-sectional dimension of less than about 1 micron.

14. The method of claim 1, wherein the microfluidic channel has at least one cross-sectional dimension between about 1 micron and about 100 microns.

15. The method of claim 1, further comprising forming an electrical connection between an electrical component and at least a portion of the solidified metal.

16. The method of claim 15, wherein the microfluidic system comprises a plurality of substantially covered microfluidic channels providing a plurality of conductive pathways after completion of the cooling act, and wherein a plurality of electrical connections are formed between a plurality of electrical components and a plurality of conductive pathways, thereby forming an electrical circuit device.

17. The method of claim 16, wherein the electrical circuit device comprises a transformer, an electromagnet, an antenna, a computer, or a radio.

* * * * *